United States Patent
Cola et al.

(10) Patent No.: US 10,724,153 B2
(45) Date of Patent: Jul. 28, 2020

(54) POLYMER-BASED NANOSTRUCTURED MATERIALS WITH TUNABLE PROPERTIES AND METHODS OF MAKING THEREOF

(71) Applicant: Georgia Tech Research Corporation, Atlanta, GA (US)

(72) Inventors: Baratunde Cola, Atlanta, GA (US); Thomas L. Bougher, Atlanta, GA (US); Kyriaki Kalaitzidou, Atlanta, GA (US); Virendra Singh, Decatur, GA (US); Matthew Smith, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 208 days.

(21) Appl. No.: 15/317,269

(22) PCT Filed: Jun. 11, 2015

(86) PCT No.: PCT/US2015/035396
§ 371 (c)(1),
(2) Date: Dec. 8, 2016

(87) PCT Pub. No.: WO2015/191897
PCT Pub. Date: Dec. 17, 2015

(65) Prior Publication Data
US 2018/0155854 A1 Jun. 7, 2018

Related U.S. Application Data

(60) Provisional application No. 62/010,679, filed on Jun. 11, 2014.

(51) Int. Cl.
*D01F 6/74* (2006.01)
*D01D 5/38* (2006.01)
(Continued)

(52) U.S. Cl.
CPC .............. *D01F 6/74* (2013.01); *B82Y 30/00* (2013.01); *C25B 9/06* (2013.01); *C25B 11/02* (2013.01);
(Continued)

(58) Field of Classification Search
CPC . B82Y 30/00; H01L 51/0017; Y10S 977/888; B81C 1/00539
See application file for complete search history.

(56) References Cited

U.S. PATENT DOCUMENTS 2,243,979 A    6/1941   Reynolds
6,250,127 B1   6/2001   Polese
(Continued)

FOREIGN PATENT DOCUMENTS

EP        2251302      11/2010
WO    2013007645    1/2013

OTHER PUBLICATIONS

Singh et al. (High thermal conductivity of chain-oriented amorphous polythiophene; Nature Nanotechnology, vol. 9, 384-390, May 2014).*

(Continued)

*Primary Examiner* — Alicia J Sawdon
(74) *Attorney, Agent, or Firm* — Pabst Patent Group LLP

(57) ABSTRACT

Nano structured surfaces and bulk composite materials which exhibit tunable surface morphology, wettability, thermal conductivity, and total thermal resistance properties, and methods of fabrication and uses thereof are described herein. Arrays of vertically-aligned nanostructures produced via a template assisted fabrication approach using nanoporous templates, or alternatively, via an electropolymerization process are described. As a result, control over the surface morphology and wettability can be achieved using the selective template etching process. The composite materials (Continued)

also demonstrate tunable thermal and electrical properties based on the methods of their fabrication. The arrays of polymeric nanostructures are chemically, mechanically, and thermally robust and can serve as soft substrates with heat dissipation capability for use in the fabrication of thermal management materials, tunable wetting for microfluidic applications, and for use in heterojunction organic photovoltaic cells.

25 Claims, 17 Drawing Sheets

(51) Int. Cl.
  *H01L 23/373* (2006.01)
  *H01L 23/42* (2006.01)
  *B82Y 30/00* (2011.01)
  *C25B 9/06* (2006.01)
  *C25B 11/02* (2006.01)
  *C25B 11/04* (2006.01)
(52) U.S. Cl.
  CPC .............. *C25B 11/04* (2013.01); *D01D 5/38* (2013.01); *H01L 23/373* (2013.01); *H01L 23/3737* (2013.01); *H01L 23/42* (2013.01); *D10B 2401/021* (2013.01); *H01L 2924/0002* (2013.01)

(56) References Cited

U.S. PATENT DOCUMENTS

| | | | |
|---|---|---|---|
| 6,921,462 | B2 | 7/2005 | Montgomery |
| 6,965,513 | B2 | 11/2005 | Montgomery |
| 7,086,451 | B2 | 8/2006 | Leu |
| 7,465,605 | B2 | 12/2008 | Raravikar |
| 8,093,715 | B2 | 1/2012 | Xu |
| 8,220,530 | B2 | 7/2012 | Cola |
| 2002/0140336 | A1 | 10/2002 | Stoner |
| 2004/0065717 | A1 | 4/2004 | Saijo |
| 2004/0105807 | A1 | 6/2004 | Fan |
| 2004/0184981 | A1 | 9/2004 | Liu |
| 2005/0214197 | A1 | 9/2005 | Gu |
| 2006/0073089 | A1 | 4/2006 | Ajayan |
| 2006/0159916 | A1* | 7/2006 | Dubrow ............. B01J 20/28007 428/357 |
| 2007/0253889 | A1 | 11/2007 | Awano |
| 2008/0095695 | A1 | 4/2008 | Shanov |
| 2008/0149166 | A1 | 6/2008 | Beeson |
| 2008/0149168 | A1 | 6/2008 | Flaherty |
| 2008/0160866 | A1 | 7/2008 | Zhang |
| 2008/0236804 | A1 | 10/2008 | Cola |
| 2008/0241755 | A1 | 10/2008 | Franklin |
| 2009/0246507 | A1 | 10/2009 | Graham |
| 2009/0315017 | A1* | 12/2009 | Song ...................... B82Y 10/00 257/24 |
| 2011/0020593 | A1 | 1/2011 | Winkler |
| 2011/0086464 | A1 | 4/2011 | Kim |
| 2012/0128880 | A1 | 5/2012 | Talapatra |
| 2012/0285673 | A1* | 11/2012 | Cola ...................... B82Y 30/00 165/185 |
| 2014/0079921 | A1* | 3/2014 | De Volder ............. B82Y 30/00 428/196 |

OTHER PUBLICATIONS

Sigma-Aldrich (Poly(3-hexylthiophene-2,4-diyl) regioregular (www.sigmaaldrich.com) Mar. 5, 2013).*
Bayer, et al., Support-Catalyst-Gas interactions during carbon nanotube growth on metallic ta films, J Phys. Chem., 115:4359-69 (2011).
Cao, et al., "High thermal conductivity of polyethylene nanowire arrays fabricated by an improved nanoporous template wetting technique", Polymer, 52:1711-5 (2011).
Cao, et al., "Polymer Nanowire Arrays With High Thermal Conductivity and Superhydrophobicity Fabricated by a Nano-Molding Technique", Heat Transfer Eng. 34:131-9 (2013).
Cola, et al., "Contact mechanics and thermal conductance of carbon nanotube array interfaces", Int. J. Heat Mass Trans., 52:3490-3503 (2009).
Cola, et al., "Photoacoustic characterization of carbon nanotube array thermal interfaces", J. Appl. Phys., 101:054313 (2007).
Dai, et al., "Controlled growth and modification of vertically-aligned carbon nanotubes for multifunctional aplications", Mater. Sci. Eng., 70:63-91 (2010).
Dawood, et al., "Modulation of surface wettability of superhydrophobic substrates using Si nanowire arrays and capillary-force-induced nanocohesion", Soft Matter 8:3549-57 (2012).
Duan, et al., "Directed Self-Assembly at the 10 nm Scale by Using Capillary Force-Induced Nanocohesion", Nano Lett., 10:3710-6 (2010). Jin, et al., "Superhydrophobic Aligned Polystyrene Nanotube Films with High Adhesive Force", Adv. Mater., 17:1977-81 (2005).
Hildreth, et al., "Conformally coating vertically aligned carbon nanotube arrays using thermal decomposition of iron pentacarbonyl", J Vac Sci Technol. B, 30(3):03D1011-03D1013 (2012).
International Search Report for corresponding PCT application for PCT/US2015/035396 dated Oct. 22, 2015.
Kang, et al., "Control of Shape and Size of Nanopillar Assembly by Adhesion-Mediated Elastocapillary Interaction", ACS Nano, 4:6323-31 (2010).
Kim, et al., "Evolution in ccatalyst morphology leads to carbon nanotube growth termination", J Phys. Chem. Lett, 1:918-22 (2010).
Liao, et al., "Contact Angle Hysteresis on Textured Surfaces with Nanowire Clusters", Nanosci. Nanotechnol., 13:2729-34 (2013).
Mao, et al., "Preparation of Lotus-Leaf-Like Polystyrene Micro- and Nanostructure Films and Its Blood Compatibility", J. Mater. Chem., 19:9025-9 (2009).
Rojo, et al., "Decrease in Thermal Conductivity in Polymeric P3ht Nanowires by Size-Reduction Induced by Crystal Orientation: New Approaches Towards Thermal Transport Engineering of Organic Materials", Nanoscale, 6:7858-65 (2014).
Singh, et al., "High Thermal Conductivity of Chain-Oriented Amorphous Polythiophene", Nat. Nanotechnol., 9:384-90 (2014).
Taphouse, et al., "A Pyrenylpropyl Phosphonic Acid Surface Modifier for Mitigating the Thermal Resistance of Carbon Nanotube Contacts", Adv. Funct. Mater., 24:465-71(2014).
Tong, et al., "Dense Vertically Aligned Multiwalled Carbon Nanotube Arrays as Thermal Interface Materials", IEEE Trans. Compon., Packag., Manuf. Technol,. 30:92-100 (2007).
Xu, et al., "Control over the Hydrophobic Behavior of Polystyrene Surface by Annealing Temperature Based on Capillary Template Wetting Method", Colloids Surf., A, 302:136-40 (2007).

* cited by examiner a  b

POLYMER-BASED NANOSTRUCTURED MATERIALS WITH TUNABLE PROPERTIES AND METHODS OF MAKING THEREOF

CROSS-REFERENCE TO RELATED APPLICATIONS

This application is a 371 application of International Application No. PCT/US2015/035396, filed Jun. 11, 2015, which claims priority to and benefit of U.S. Provisional Application Ser. No. 62/010,679, filed on Jun. 11, 2014, which is incorporated herein by reference in its entirety where permitted.

STATEMENT REGARDING FEDERALLY SPONSORED RESEARCH OR DEVELOPMENT

This invention was made with government support under award number 1133071 awarded by the National Science Foundation. The government has certain rights in the invention.

FIELD OF THE INVENTION

The various embodiments described herein are directed to nanostructured polymer-based arrays having tunable surface morphologies, wettability, and thermal conductivity and resistances, as well as methods of making and uses thereof.

BACKGROUND OF THE INVENTION

High aspect ratio, polymer nanotubes (PNTs) and nanowires exhibit remarkable electrical, thermal, and mechanical properties which can be attributed to preferential chain alignment and high surface area to volume ratios. For example, polythiophene nanotube array thermal interface materials (TIMs) (Singh, V., et al. *Nat. Nanotechnol.* 2014, 9, 384-390) and polyethylene nanowire arrays (Cao, B. Y., et al. *Polymer* 2011, 52, 1711-1715 and Cao, B. Y., et al. *Heat Transfer Eng.* 2013, 34, 131-139) have been reported that exhibit dramatically improved anisotropic thermal conductivity. There have also been multiple reports on the use of vertically aligned, high-aspect-ratio polymer nanotubes to create surfaces with superhydrophobic and tunable wetting properties (Cao, B. Y., et al. *Heat Transfer Eng.* 2013, 34, 131-139; Jin, M., et al. *Adv. Mater.* 2005, 17, 1977-1981; Mao, C., et al. *J. Mater. Chem.* 2009, 19, 9025-9029; Liao, Y. C., et al. *Nanosci. Nanotechnol.* 2013, 13, 2729-2734; and Xu, J., et al. *Colloids Surf, A* 2007, 302, 136-140).

Typically, for wetting and thermal interface applications, nanotube arrays are grown on a substrate where the bottom of the array is anchored and the other end consists of free tips. Due to the wet processing conditions used, and because the densely packed tubes have high aspect ratios, the vertical arrays have the tendency to bundle and aggregate during processing through elastocapillary coalescence (Cao, B. Y., et al. *Heat Transfer Eng.* 2013, 34, 131-139; Jin, M., et al. *Adv. Mater.* 2005, 17, 1977-1981; Xu, J., et al. *Colloids Surf, A* 2007, 302, 136-140; and Duan, H. et al. *Nano Lett.* 2010, 10, 3710-3716), which occurs when capillary forces cause objects to elastically bend into contact with each other upon which the objects stick together through adhesion. Nanotube aggregation can dramatically alter the surface morphology and the corresponding interactions between the PNT array and a contacting liquid or substrate.

Despite their high intrinsic thermal conductivities, thermal contact resistance (TCR) has been a major limitation of high aspect ratio structures such as carbon nanotube (CNT) array TIMs (Cola, B., et al. *J. Appl. Phys.* 2007, 101, 054313; Taphouse, J. H., et al. *Adv. Funct Mater.* 2014, 24, 465-471; and Tao, T., et al. *IEEE Trans. Compon., Packag., Manuf. Technol.* 2007, 30, 92-100). Furthermore, the favorable mechanical properties and strong adhesion of soft materials suggests that PNTs could potentially reduce the high contact resistance associated with traditional nanotube interfaces.

Bulk polymers, however, are commonly considered thermal insulators owing to their low thermal conductivities, which are typically on the order of 0.2 Wm$^{-1}$K$^{-1}$ at room temperature. The low thermal conductivity of these materials is caused by the random orientation of the molecular chains in amorphous regions (Choy, C. L., *Polymer* 1977, 18(10), 984-1004; and Henry, A. *Ann Rev Hear Transfer* 2013:DOI: 10.1615/Annual Rev Heat Transfer. 20 13006949.1, 2, which reduces the mean free path of heat conducting phonons. Previous studies to enhance the thermal conductivity of polymers have thus focused on semi-crystalline polymers which can degrade at temperatures as low as 125° C.

Furthermore, previously reported methods drawn to the fabrication of high aspect ratio polymer nanostructures with tunable surface morphology, and thus surface properties, remain relatively complex, often relying on lithographic processes, special drying conditions, or varying structure dimensions, so there is a need to develop simple and facile approaches (Liao, Y. C., et al. *Nanosci. Nanotechnol.* 2013, 13, 2729-2734; Xu, J., et al. *Colloids Surf, A* 2007, 302, 136-140; Duan, H. et al. *Nano Lett.* 2010, 10, 3710-3716; Dawood, M. K., et al. *Soft Matter* 2012, 8, 3549-3557; and Kang, S., et al. *ACS Nano* 2010, 4, 6323-6331). In another example, nanoscale hierarchy has shown to create surfaces with tunable wetting properties (U.S. Publication No. 2013/0062204 and U.S. Pat. No. 8,293,140), but the methods described involved the use of complex, multi-step deposition processes.

Thus, facile methods for forming nanostructured polymer-based arrays with tunable properties remain a challenge.

Therefore, it is an object of the invention to provide polymer-based nanostructured materials with surface morphologies which can be selectively tuned in order to control the surface wettability, thermal, and electrical properties of the materials.

It is a further object of the invention polymer-based nanostructured materials demonstrating chain alignment within a purely amorphous polymer material with tunable properties.

It is a further object of the invention to provide methods of making such polymer-based nanostructured materials with tunable properties, and uses thereof.

SUMMARY OF THE INVENTION

Arrays of polymeric nanostructures and methods of use thereof are provided. Certain embodiments provide arrays having tunable characteristics. For example, the arrays have one or more of the following tunable characteristics: surface morphologies, wettability, thermal conductivity, and resistances, for example thermal resistances.

An exemplary array contains vertically aligned polymer-based nanostructures such as polymer nanotubes (PNT). In one embodiment, the PNTs are formed by casting polymer solutions in nanoporous templates. Subsequently, a time-dependent template solvent etching process can be applied to partially remove the template and alter the surface morphology of the PNT array as described below. The altered surface morphology of the PNT arrays results in hierarchical surface structuring having a pattern of interconnected ridges, where the spacing between the ridges increases as a function of increasing template etch time. In other embodiments, the template etching processing time can be used to control the surface morphology thereby allowing for precise tuning of the PNT array's surface wetting and contact thermal energy transport properties.

A different embodiment provides chain-oriented polymer-based arrays that are typically fabricated using an electrochemical polymerization process. The electrochemical polymerization process forms polymeric nanostructures in a nanoporous template. The polymeric nanostructures of the arrays can be chain-oriented, amorphous, or substantially amorphous polymers.

Another embodiment provides an array having densely packed polymeric nanostructures forming a surface morphology characterized by interconnected ridges. In a preferred embodiment, the interconnected ridges have a constant width (W) along the ridge and a constant spacing (S) between the ridges. In certain embodiments, the interconnected ridges of the PNT array form percolating ridges. The surface morphology of the array can be defined by its surface fraction, f, wherein the exposed nanostructures form bundled clusters and gaps. As clustering increases, the percent and size of the gaps increases and the surface fraction decreases.

As shown in FIGS. 3A-3D, a simple model can be used to explain the morphological changes which the array surfaces undergo due to alterations resulting from the partially released nanotube/nanowire length, wherein the ridge spacing formed on the surface of the array directly relates to the surface fraction.

Still another embodiment provides a vertically aligned polymer array in which the contact angle (CA) of a wetting fluid on the surface of the array has a CA of about 90° to about 170°. The CA can be controlled as a function of the etching time applied and followed by a thermal treatment. The longer the etching time, the greater the CA. In certain embodiments, the array can have increasing hydrophobicity by increasing the etching treatment time. One embodiment provides a superhydrophobic array of nanostructures.

Additional embodiments provide arrays of polymeric nanostructures in which the thermal conductivity or the thermal contact resistance (TCR) between the ends or tips of the polymeric nanostructures and a surface or both can be tuned as a function of the etch time applied. In certain other embodiments, the thermal conductivity or the thermal contact resistance (TCR) between the ends or tips of the polymeric nanostructures and a surface or both can be tuned based on the chain-orientation of the polymers forming the polymeric nanostructures of the array.

Still another embodiment provides composite arrays of polymeric nanostructures in which the contact resistance values of the composite arrays are in the range of about 15 $mm^2 \cdot K \, W^{-1}$ to about 45 $mm^2 \cdot K \, W^{-1}$. In some embodiments, the contact resistance values can be selectively modified as a function of the etch time applied according to the methods described herein.

In some embodiments, the thermal conductivities are in the range of about 0.1 to about 5 $W \, m^{-1} \, K^{-1}$. In certain embodiments, the thermal conductivities of individually polymer nanostructures or of arrays of polymer nanostructures are approximately one to five-fold larger than that of the equivalent bulk film value of the same polymer due to molecular chain alignment in the direction of heat transfer, which enables the material to produce very low thermal transport resistances for a pure polymer. In certain embodiments, the thermal conductivities of the polymer nanotube arrays are stable at least up to a temperature of about 250° C.

One method of making a polymer-based array includes a first step of forming the polymer-based arrays using a suitable nanoporous template. The nanoporous template can be wetted with a polymer-containing solution and then dried to form polymeric nanostructures. In certain embodiments, the nanoporous template is a nanoporous anodic alumina (AAO) template. The polymer solution wetted into the nanoporous template is formed into nanostructures which include, but not limited to polymer nanotubes, nanofibers, nanowires, or combinations thereof, of any shape, upon drying of the solution solvent. A template etching process (i.e., by applying an etchant to the template) can be applied to the template for a suitable period of time in order to at least partially expose the plurality of polymeric nanostructures formed, and which may be in the form of nanotubes, nanowires, or combinations thereof. In some embodiments, the process is applied to the top surface of the template only or to the top and bottom of the template to at least partially expose the plurality of polymeric nanostructures formed at each face of the template. A thermal treatment step can be applied following the etching process.

Some polymer-based arrays containing chain-oriented polymer nanostructures can be fabricated by an electrochemical polymerization process. Once the chain-oriented polymer-based arrays are formed, they can be transferred to another substrate.

A nanoporous template (e.g., porous anodic alumina) can be placed on a conducting substrate which serves as the working electrode in a three electrode electrochemical setup. In non-limiting examples, a solution containing monomers of a suitable polymer (e.g., polythiophene or another solution-processable polymer) is prepared and introduced into the channels of the anodic template. A voltage is subsequently applied between the working and counter electrodes forming a potential field. The potential field causes electropolymerization of the monomer to form polymeric nanostructures. The polymeric nanostructures are formed of a chain-oriented amorphous or substantially amorphous polymer within each channel in the nanoporous template. The nanoporous template can be partially or completely removed using any suitable means in order to liberate the vertically aligned array of polymer nanofibers, for example using a suitable etchant.

The described nanostructured polymer-based arrays can be used in applications, including, but not limited to cooling of electronics in automotive applications, in military electronics, for waste heat recovery, and in heat exchangers. In certain embodiments, the nanostructured polymer-based arrays described can have thermal stability up to 300° C. or higher and are well-suited for elevated-temperature applications. In one non-limiting example, thermal interface layers (TIM), based on the nanostructured polymer-based arrays can to operate reliably up to a temperature where other previously reported TIMs cannot. The described nanofiber arrays can be used, for example, as thermally conducting dielectric materials for printed circuit boards (PCB) with improved heat dissipation and mechanical flexibility. For example, light emitting diodes (LEDs) are often mounted on metal surfaces with the need for a thermally conductive, but electrically insulating layer to separate the LED circuit from the metal base. The nanostructured arrays can be used in organic electronic devices where high surface area or special architecture are required for operation.

BRIEF DESCRIPTION OF THE DRAWINGS

In FIG. 1A, step 1 is shown wherein the AAO nanoporous template is wetted with rr-P3HT solution. After drying, KOH is pipetted on top of the template to begin the top-down template etching process (step 3). For steps 3a, 3b, and 3c, the increase in bundle size as the etch time increases from t1 to t3 is shown. In FIG. 1B the formation of ridges for large surface area, densely packed polymer arrays is shown where S is the spacing between ridges, L is the nanotube length, H is the array height, and W is the ridge width.

DETAILED DESCRIPTION OF THE INVENTION

Figure 1A:
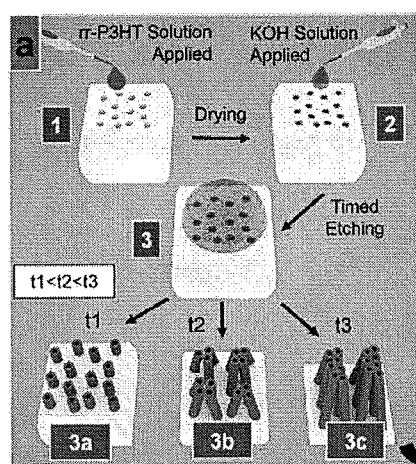
FIGS. 1A and 1B depict a non-limiting illustrative example of a solution-based method to fabricate arrays of vertically aligned polymer nanotubes and nanotube bundles.

Arrays formed of vertically aligned polymer-based nanostructures, methods of making, and uses thereof are described herein.

I. Definitions

"Template," or "Nanoporous Template", as used herein, refer to a nanoporous material containing a plurality of nanochannels or nanotunnels having any suitable geometry which are 1 μm or less in diameter. The length of the channels or tunnels is not limited to any particular length and the plurality of channels or tunnels of the template which are vertically aligned when they are substantially perpendicular to a surface of the template. A variety of materials can serve as a nanoporous template. In some embodiment, the support is formed at least in part from, but not limited to, aluminum oxide, track-etched polycarbonate, iron oxide, titanium oxide, silicon oxide templates, and Au, Ag, and Cu metal wherein the templates have some degree of nanoporosity and can be used to fabricate polymer nanowire arrays.

"Photoacoustic method," as used herein, refers to a method which can measure the resistance and thermal conductivity of a layer and both measurement techniques as described in further detail in the art (see Taphouse, J. H., et al. *Adv. Funct. Mater.* 2014, 24, 465-471 and Singh, V., et al. *Nat. Nanotechnol.* 2014, 9, 384-390). The PA method works by heating a sample with a modulated laser and measuring the acoustic response in a chamber that is sealed atop the sample. Pressure waves are generated in the chamber due to localized heating at the sample surface and the magnitude and phase of these waves can be correlated to the thermal properties of the sample.

"Polymer Nanotube Array" or "PNT array," as used herein, refer to a plurality of polymer nanotubes which are vertically aligned on a surface of a material. Polymer nanotubes are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

"Polymer Nanofiber Array," as used herein, refer to a plurality of polymer nanofibers which are vertically aligned on a surface of a material. Polymer nanofibers are said to be "vertically aligned" when they are substantially perpendicular to the surface on which they are supported or attached. Nanofibers are said to be substantially perpendicular when they are oriented on average within 30, 25, 20, 15, 10, or 5 degrees of the surface normal.

"Surface fraction," which may also be denoted f, as used herein, is related to the number of nanotubes per cluster predicted using Equation (1), below, where:

$$f \sim \sqrt{500/N}$$

wherein N is the number of nanotubes and 500 represents a fitting constant. The surface fraction is the ratio of the total surface area to the surface area in contact with nanotubes.

"Contact angle", as used herein, refers to the angle of incidence of a water droplet in air (i.e., a liquid/vapor interface) on the surface of a solid material wherein the angle is measured through the liquid. In one embodiment, the water contact angle (CA) can be measured with a goniometer.

"Thermal contact resistance," as used herein, refers to when two surfaces are in thermal contact and resistance to heat transfer between the surfaces exists.

"Thermal conductivity," as used herein, refers to the transport of energy in the form of heat through a body of mass as the result of a temperature gradient and is determined as the heat energy transferred per unit of time and per unit of surface area divided by the temperature gradient. Thermal conductivity is typically expressed in units of $W\ m^{-1}K^{-1}$.

"Wettability," as used herein refers to the interaction between a wetting fluid and solid phase, such as a surface and can be further defined by the contact angle of the fluid with the solid phase.

II. Nanostructured Polymer-Based Arrays

Nanostructured polymer based arrays and methods of making, and using them are described below. Some embodiments provide vertically aligned arrays of polymeric nanostructures. The vertically aligned arrays of polymer structures can be formed by casting polymer solutions in nanoporous templates. Subsequently, a time-dependent template solvent etching process can be applied to partially remove the template and alter the surface morphology of the exposed array as described below. The altered surface morphology of the arrays results in hierarchical surface structuring having a pattern of interconnected ridges. The spacing between the ridges increases as a function of increasing the template etch time. One embodiment provides an array formed of a plurality of rows of vertically aligned polymeric nanostructures, wherein the nanostructures have a base and an end tip, and at least two of the end tips of the nanostructures are in contact to form a bundle having tip, and wherein at least the tips of two bundles are in contact to form a ridge and wherein the array comprises a plurality of ridges, wherein at least two ridges are interconnected and wherein each ridge has a constant width (W) along the ridge and there is spacing (S) between the ridges which can be uniform or non-uniform.

Other embodiments provide chain-oriented polymer-based arrays. These arrays can be fabricated using an electrochemical polymerization process which forms polymeric nanostructures in a nanoporous template. In non-limiting embodiments, the array is formed of a plurality of vertically aligned polymeric nanostructures wherein the nanostructures comprise a chain-oriented amorphous polymer.

A. Polymer Nanostructures

The one or more polymers which form the nanostructures of the arrays can be formed of any suitable polymer including naturally occurring and synthetic polymer and is not particularly limited with respect to any molecular weight range or polydispersity. In certain embodiments, the polymer is selected from conjugated polymers, wherein at least a portion of the polymer chain contains a pi-conjugated backbone. In other non-limiting embodiments, the polymer is selected to be stable to high temperatures of above 100° C., above 150° C., above 200° C., or 250° C. or higher. In certain other embodiments the one or more polymers used to form the nanotube arrays are solution-processable polymers, which are soluble or at least partially soluble in, but not limited to organic solvents. In some embodiments, the polymers are stable to aqueous environments. Exemplary polymers, which may be used to form nanostructures, such as nanotube and/or nanofiber arrays include, but are not limited, to polythiophene, polypyrrole, poly(3-hexylthiophene), polystyrene, polypropylene, poly(ethylene), poly(ethylene oxide) poly(3,4-ethylenedioxythiophene), poly(m-ethylmethacrylate), poly(acrylates), poly(tetrafluoroethylene), polyvinylidene fluoride, and polyaniline. In certain non-limiting embodiments, the polymeric nanostructures are formed of polythiophene of low molecular weight. In certain other embodiments the polymeric nanostructures are formed of a high molecular weight and high density polyethylene.

In certain embodiments, the polymer is regioregular poly(3-hexylthiophene), denoted rr-P3HT, which are not limited to any particular molecular weight range or polydispersity. Regioregular polythiophenes are known in the art. The regioregular polythiophene can be soluble in organic solvents. The degree of regioregularity can be, but is not limited to, at least 85%, at least 90%, at least 95%, or at least 98%.

In certain embodiments, where chain-oriented polymer-based arrays are fabricated through an electrochemical polymerization process any suitable monomer which can undergo electropolymerization can be used.

In some embodiments, the polymers are formed into nanofibrous structures which include, but not limited to polymer nanotubes, nanofibers, nanowires, or combinations thereof, of any shape. Such polymer nanotubes, nanofibers, or nanowire structures are not limited to any particular length or diameter. In some embodiments, the length of nanostructure is greater than the diameter of the nanostructure, such that the nanotubes and/or wires have a high aspect ratio. In some embodiments, the polymer nanofibers can have a length in the range of about 1 nm up to about 10 μm, more preferably up to about 5 μm, and most preferably up to about 1 μm. In some non-limiting embodiments, the polymer nanofibers have diameters which are approximately in the range of 1 to 500 nm, more preferably 100 to 400 nm, and most preferably 150 to 300 nm. In another non-limiting embodiment, wherein the polymeric nanostructures form polymer nanotubes, the walls of the nanotubes have thicknesses which are in the range of 1 to 75 nm, more preferably 10 to 50 nm, and most preferably 20 to 40 nm. It should be understood that the particular lengths, diameters, and thicknesses of the polymer nanofiber structures may be uniform or non-uniform, or alternatively may include some degree of variation across the plurality of polymer nanostructures which form the arrays.

Figure 9:
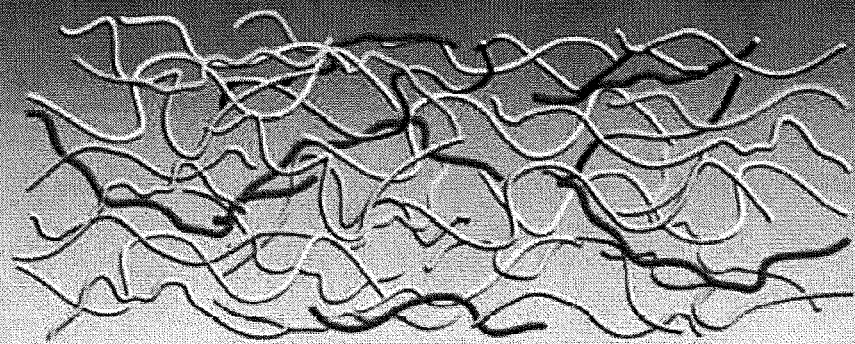
FIG. 9 shows an illustrative example of chain orientation morphology in an amorphous polymer without folded crystalline domains.

In certain embodiments, the polymer nanostructures of the arrays described are formed of or contain chain-oriented amorphous or substantially amorphous polymers (see FIG. 9). In certain other embodiments the polymer nanostructures possess some degree of crystallinity. Suitable methods for determining polymer crystallinity include, but are not limited to electron diffraction, high-resolution transmission electron microscopy, and x-ray diffraction (XRD) analyses. In some embodiments, a polymer-based array includes a plurality of vertically aligned polymer nanostructures wherein the nanostructures are formed of or include a chain-oriented amorphous polymer.

In certain embodiments, the degree of chain orientation of the polymer nanostructures formed exhibit structural anisotropy and estimates of the dichroic ratio and orientation function can be made using techniques described below. In non-limiting examples, a dichroic ratio greater than 1 indicates a preferential molecular chain alignment, and can be used to estimate the percentage of chains aligned parallel to the polymer fiber or nanotubes' axis. In some embodiments, the dichroic ratios of the polymer nanostructures of the array are in the range of 0.5 up to 5.0. In other embodiments, the preferential percentage of orientation is in the range of about 5% up to about 50%. In certain embodiments, the degree of chain orientation along the amorphous PT nanofiber axis was found to increase significantly as a function decreasing fiber diameter. In some embodiments, the nanostructures can possess short-range ordering, while long-range order is absent or substantially absent. In certain embodiments, the polymer nanostructures possess a degree of chain orientation which is along the fiber axis, and both the degree chain orientation and thermal conductivity increase in relation to a decrease in the diameter.

B. Array Surface Morphology

The surface morphology of a PNT array produced according to the methods described herein can result in packed polymer arrays having a surface morphology characterized by interconnected ridges which exhibit a constant width (W) along the ridge and spacing (S) between the ridges. In certain embodiments, the ridge width, W, is in the range of about 0.1 μm up to about 10 μm, more preferably about 0.25 μm up to about 5 μm, and most preferably about 0.5 μm up to about 2.5 μm. In certain embodiments the spacing, S, is in the range of about 1 μm up to about 50 μm, more preferably about 5 μm up to about 30 μm. In certain embodiments, the interconnected ridges of the PNT array form percolating ridges. Ridges are formed from at least two of the end tips of the nanostructures which are in contact to form a bundle having tip, and wherein at least the tips of two bundles are in contact to form one or more ridges. The array comprises a plurality of ridges, wherein at least two ridges are interconnected and wherein each ridge has a constant width (W) along the ridge.

Without wishing to be bound by any particular theory, by applying a volume of a suitable etchant for a particular amount of time, it is possible to controllably remove at least some of the surface of the nanoporous template, in which the vertically aligned polymer nanostructures are formed. This permits precise control of the length of fibrous polymer nanostructures which are freed and depending on the length of the etching time the exposed polymer nanotube and/or nanowire length increases. Capillary action drives bundling of the exposed polymer nanotubes and/or nanowires resulting in distinct ridge formation. The ridging effect occurs due to elastocapillary forces which pull the nanotubes together, and once capillary forces are not present (i.e., following evaporation of the wetting agent), the nanotube clusters/bundles are preserved via intertube adhesion (Kang, S., et al. *ACS Nano* 2010, 4, 6323-6331). The longer the etch time, the greater the length of exposed polymer nanostructures and the greater the degree of nanotube clustering.

In one non-limiting example of rr-P3HT nanotube arrays, as shown in FIGS. 2A-2D, the surface fraction, denoted f, as a function of etch time, can be determined from heavily contrasted images taken via scanning electron microscopy (SEM) (not shown) and used to attain the pixel counts for the ridged regions of the arrays. The traced ridges clearly illustrate ridge widening as the etch time increases from 6 to 12 min, respectively, and further shows the corresponding percolation ridge traces. The surface fraction, f, is reduced from 0.20±0.02 for the 6 min etch time to a minimum of 0.06±0.01 for the 12 min etch time. Without wishing to be bound by theory, the relationship between etch time and surface fraction appears to be non-linear since the magnitude of change in surface fraction decreases with etch time. The nanostructures can cluster to form bundles having a tip. One or more bundle tips can come in contact to form ridges and one or more ridges can be spaced to form gaps. As clustering increases the percent and size of the gaps increases and the surface fraction decreases. In some embodiments, PNTs have a surface fraction, f, which is in the range of about 0.01 to about 0.30. In certain embodiments, the surface fraction, f, decreases as the contact angle increases.

Figures 3A, 3B:
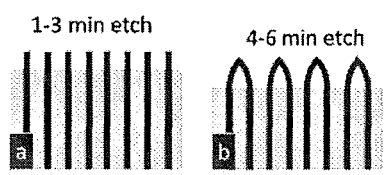
FIGS. 3A, 3B, 3C, and 3D show illustrations of a simple model used to explain the formation of ridges and the increase in spacing between ridges with increasing etch times (minutes).
Figures 3C, 3D:
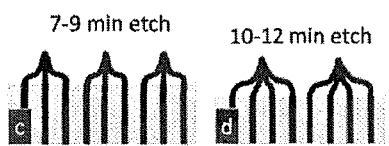
Figure 3E:
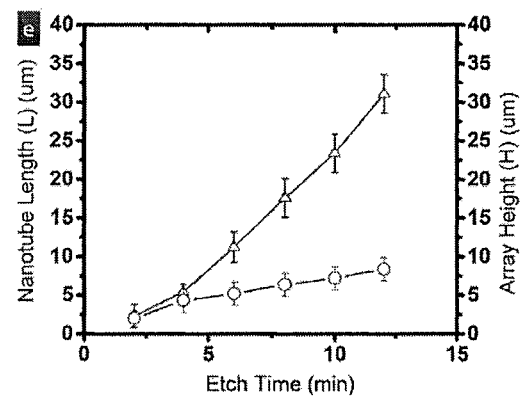
FIG. 3E is a graph showing the relationship between the length, L (μm), of exposed nanotube and the array height, H (μm), as the etch time (minutes) increases wherein the line of open circles represents H and corresponds to the array height axis, whereas the line of open triangles represents L and corresponds to the nanotube length axis.
Figure 4:
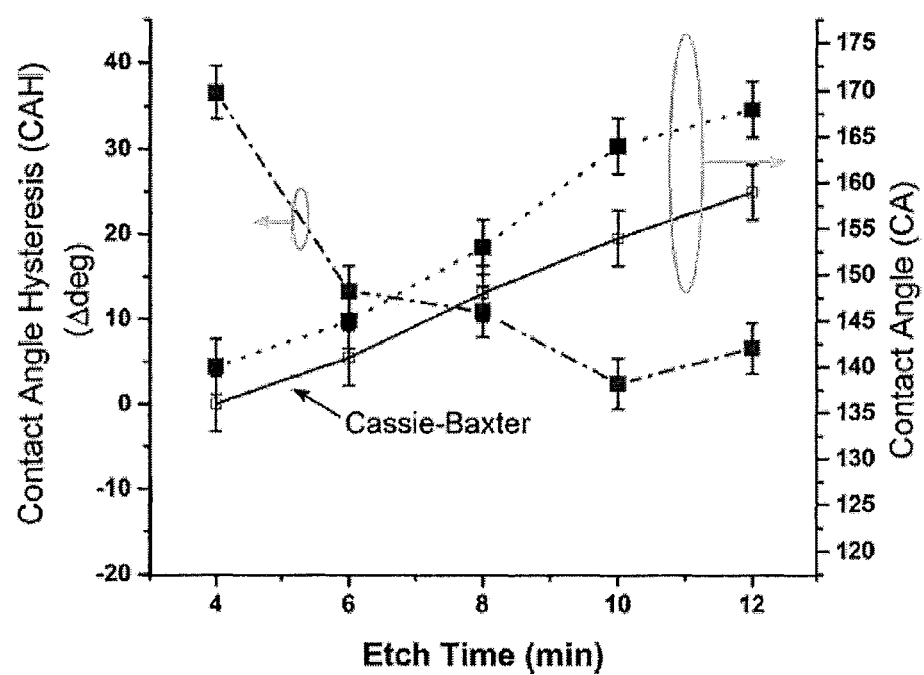
FIG. 4 is a graph which depicts the surface wetting properties as a function of increasing etch time (minutes) from 4 to 12 minutes, wherein the solid squares correspond to the contact angle hysteresis (Δdeg) axis, the squares correspond to the contact angle (CA) axis, and the open squares represent the theoretical Cassie-Baxter model contact angle calculated using the measured surface fractions and the intrinsic CA of 102° and also corresponds to the CA axis.

As shown in FIGS. 3A-3D, a simple model can be used to explain the morphological changes which the array surfaces undergo due to alterations resulting from the partially released nanotube/nanowire length. As the etch time increases, the exposed length of the nanotube/nanowire increases, and the elastic force required to bend the nanotubes is reduced (Hill, J., et al. *ACS Appl. Mater. Interfaces* 2010, 2, 1992-1998). At the early stages of the etching process, the nanotube tips bend together and wide ridges form where the tip clusters are joined (FIG. 3B). As the etch time increases further, the ridges continue to add additional nanotubes, and they become more densely packed forming sharp ridge peaks (FIG. 3C). The sharp ridges grow further apart and eventually begin to flatten and collapse into each other as they become more isolated (FIG. 3D). The exposed polymer nanotube/nanowire length increases in an essentially linear manner and as the thickness of the etched nanoporous template decreases with time.

C. Surface Wetting Properties of Arrays

The ridge spacing formed on the surface of the array directly relates to the surface fraction, which can be used to estimate wettability, assuming Cassie-Baxter (CB) behavior (Gennes, F., et al. *Phys. Today* 2004, 57, 120000-120067). The surface fraction of the PNT array decreases as etch time and ridge formation increases.

In preferred embodiments, the surface modified arrays formed according to the methods described herein are subjected to a thermal treatment following surface modification. In one non-limiting example, following treatment with an etchant, the array was subjected to a thermal treatment by placing the templates on a heating source at 250° C. with the exposed nanostructures preferably facing upward for 10 seconds and then followed by rapid cooling under ambient conditions. In some embodiments, the thermal treatment occurs at temperatures at or above 150° C., at or above 200° C., or at or above 250° C. In some embodiments, the time length of the thermal treatment applied is in the range of, but not limited, to about one second up to about 1 min, more preferably about 5 seconds up to about 45 seconds, and most preferably about 10 seconds up to about 30 seconds. Rapid cooling, typically refers to but is not limited to a thermal quenching process wherein the heated sample is exposed to a temperature controlled bath at about room temperature or below. In some embodiments, the thermal treatment can be carried out under an inert atmosphere.

Without wishing to be bound by any particular theory, application of a thermal treatment step following the etching treatment is believed to result in thermodynamically driven diffusion and polymer chain conformational changes during heating which modify the surface thereby rendering the surface more hydrophobic. In certain embodiments, a change in surface mechanics may be attributed to a change in polymer crystallinity, which could the elastic modulus of the tubes (Tan, et al., *Nanotechnology* 2006, 17, 2649-2654), or lead to a welding phenomenon where adhesion is improved due to at least a partial sintering effect. Thus, the thermal treatment may induce, but is not limited to, a thermal reconstruction effect, a thermal sintering effect, or some combination of both of these effects.

In certain embodiments, the polymer arrays having a modified surface morphology characterized by interconnected ridges which exhibit a constant width (W) along the ridge and spacing (S) between the ridges which depend on the etching time applied. In certain embodiments, the ridge width, W, is in the range of about 0.1 μm up to about 10 μm, more preferably about 0.25 μm up to about 5 μm, and most preferably about 0.5 μm to about 2.5 μm. In certain embodiments the spacing, S, is in the range of about 1 up to about 50 μm, more preferably about 5 up to about 30 μm. In some embodiments, the contact angle (CA) of a drop of deionized (DI) water increases as a function of the length of time of the etching process applied to the array template surface.

Without wishing to be bound by any particular theory, the CA varies depending on the surface fraction, f, according to the Cassie-Baxter model, as described by the following equation (Gennes, F., et al. *Phys. Today* 2004, 57, 120000-120067):

$$\cos(\theta^*) = -1 + f(\cos(\theta_0) + 1) \quad (1)$$

where $\theta^*$ is the apparent CA that results from structuring, $\theta_0$ is the contact angle on a smooth surface, and f is the surface fraction. Yet another important wetting property is the contact angle hysteresis (CAH), which is a measurement of the difference between the advancing contact angle (ACA) and receding contact angle (RCA), (CAH=ACA−RCA). The CAH quantifies the adhesiveness of a surface to a wetting fluid; the larger the CAH, the more adhesive the surface is to that fluid (Gennes, F., et al. *Phys. Today* 2004, 57, 120000-120067).

In some embodiments, the CA of a wetting fluid on the surface of a vertically aligned polymer array produced according to the methods described herein has a CA of about 90° to about 170°. The CA can be controlled as a function of the etching time applied and followed by a thermal treatment.

The polymer array surfaces formed according to the methods described herein can be rendered superhydrophobic if subjected to a sufficiently long etching treatment time. "Superhydrophobic," as used herein, refers to a surface having a CA greater than 150° with a maximum contact angle of approximately 170° and a CAH which is less than or equal to 10° (Wong, T.-S., et al. *MRS Bull.* 2013, 38, 366-371). In some embodiments, the etching time required to render the surface of the array superhydrophobic is approximately 8 minutes or longer. In preferred embodiments, the etching treatment is applied for about 8 to about 12 minutes.

Based on the Cassie-Baxter model relation, it was found that a small surface fraction, f, produced a large CA and a large surface fraction produced a smaller CA. The largest deviations from the model occurred at the lowest surface fractions (i.e., longest etch times), but even at these values the experimental results are within 10° of the calculated values. Nevertheless, the Cassie-Baxter model-based comparison used validated the predicted interaction between the surface and wetting fluid droplet.

D. Thermal Properties of Arrays

The thermal conductivity or the thermal contact resistance (TCR) between the ends or tips of the polymer nanostructures and a surface or both can be tuned as a function of the etch time applied. In certain embodiments, the thermal conductivity and the thermal contact resistance (TCR) between the ends or tips of the polymer nanostructures and a surface can be tuned based on the chain-orientation of the polymers forming the polymer nanostructures of the array.

A suitable technique for determining the conductivity and resistance of the array is the photoacoustic (PA). The PA method is a well-accepted technique capable of measuring the thermal properties of nanostructured materials (Cola, B. A., et al. *J Appl. Phys.* 2007, 101, 054313; and Hangping, H., et al. *Appl. Phys.* 1999, 86, 3593). The PA method works by heating the sample with a modulated laser and measuring the acoustic response in a chamber which is sealed atop the sample. More details regarding the PA method may be found in publications (Singh, V., et al. *Nat. Nanotechnol.* 2014, 9, 384-390; Cola, B. A., et al. *J. Appl. Phys.* 2007, 101, 054313; and Wang, X., et al. *Annual Review of Heat Transfer*; Begell House, Inc: Danbury, Conn., 2013; Vol. 16, pp 135-157, which are incorporated herein by reference).

In certain other embodiments, the thermal conductivity of individual nanofibers or vertically aligned arrays formed according to the methods described herein can be measured using a suspended microbridge technique as described below. In other embodiments total resistance can be measured by a 1D reference bar (ASTM D5470) and thermal conductivity can be measured by laser flash diffusivity.

1. Thermal Conductivity and Resistance

Figure 5A:
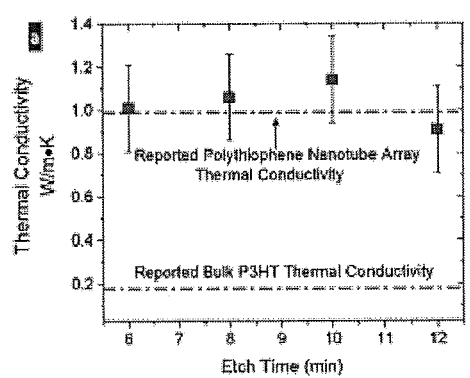
FIG. 5A is a graph which shows that as the etch time (minutes) increases from 6 to 12 minutes the array thermal conductivity (W m$^{-1}$ K$^{-1}$) (indicated by the square markers) remains nearly constant within the range of uncertainty.
Figure 5B:
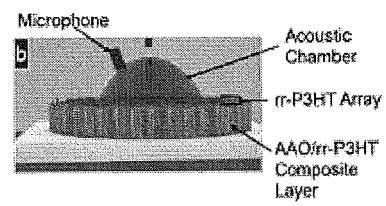
FIGS. 5B and 5C are illustrations of the photoacoustic array thermal conductivity and interface resistance measurement assemblies, respectively.
Figure 5C:
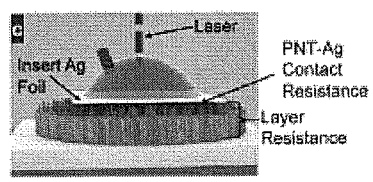
Figure 6:
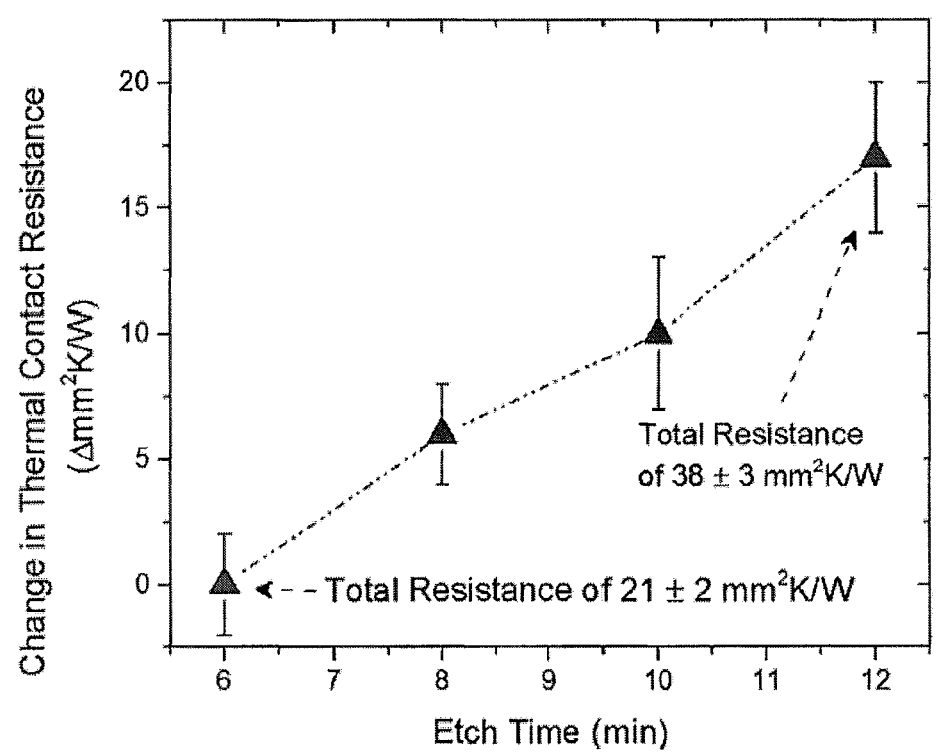
FIG. 6 is a graph depicting the total thermal interface resistance, which is the measured sum of the resistance between the PNT tips and the silver foil ($R_{PNT-AG}$), the layer resistance of the nanotube array, the PNT-AAO composite layer resistance, and the interface resistance between the nanotubes and the composite structure, for the surfaces with 6, 8, 10, and 12 minutes of etch times as indicated by the line with triangular markers.

In certain embodiments, the thermal conductivity of the polymer arrays is approximately 1 W m$^{-1}$ K$^{-1}$, independent of the period of the etch time used (FIG. 5A). In one non-limiting example, where the nanoporous template had a porosity of ~50% (as reported by the manufacturer), the estimated thermal conductivity of individual rr-P3HT nanotubes was calculated to be ~2 W m$^{-1}$ K$^{-1}$, which is approximately an order of magnitude higher than the reported bulk film value of rr-P3HT (Duda, J. C., et al. *Appl. Phys. Lett.* 2013, 102, 251912) and is in good agreement with the reported thermal conductivity of melt processed semicrystalline P3HT nanowires, with similar diameters (Rojo, M. M., et al. *Nanoscale* 2014, 6, 7858-7865).

Without wishing to be bound by any particular theory, it has been shown that directional chain alignment can enhance thermal conductivity in amorphous polymer nanostructures (Singh, V., et al. *Nat. Nanotechnol.* 2014, 9, 384-390), and that crystallinity may also improve thermal transport (Rojo, M. M., et al. *Nanoscale* 2014, 6, 7858-7865). Therefore, the results suggest that anisotropic chain alignment is promoted by used of the methods described herein, as in the non-limiting example based on rr-P3HT, the nanotubes appear to be amorphous from electron diffraction analysis performed on several of the samples (not shown).

In certain non-limiting examples, the impact of the surface fraction, f, on the thermal transport was determined by measuring the total thalami resistance of the array-AAO template composite in contact with silver foil. In one non-limiting example, it was found that the array thermal conductivity did not change with etch time and that thermal transport through a composite AAO/rr-P3HT layer was limited by contact resistance between the template walls and the parts of the nanotubes which were still within the template (i.e., the path of least thermal resistance is from the tip to the base of the PNTs). The change in total thermal resistance was likely dominated by the change in the PNT-Ag contact resistance. The total resistance value corresponds to the sum of the resistance between the polymer nanotube tips and the silver foil (denoted $R_{PNT-AG}$), the layer resistance of the nanotube array, the nanotube array-AAO composite layer resistance, and the interface resistance between the nanotubes and the composite structure.

In certain embodiments, the total thermal resistance increased from an initial baseline value as the etch time was increased. In a non-limiting example, a rr-P3HT nanotube array-AAO template composite prepared according to the methods described herein had a total thermal resistance of $21\pm2$ mm$^2\cdot$K W$^{-1}$ as measured after an etch time of 6 minutes. The total thermal resistance increased up to a value of $38\pm3$ mm$^2\cdot$K W$^{-1}$ when a 12 minute etch time was applied. Without limitation, it was found that the rate of increase is approximately 6 mm$^2\cdot$K W$^{-1}$ per 2 minute interval of time. Without wishing to be bound by theory, the increase in thermal resistance is believed to be due to a decrease in the number of ends/tips in contact with the surface and possibly due to a slight decrease in the array thermal conductivity as the fibrous polymeric structures, which may be nanotubes and/or nanowires, collapse and lose their vertical alignment. The collapse of nanotubes decreases the thickness of the sample (i.e., the exposed portion of the array plus the remaining template), which likely reduces the combined layer resistances with increased etch times. Thus, the increase in contact resistance with etch time is likely even larger than what can be concluded directly from the measurements of total thermal resistance.

In certain embodiments, the thermal contact resistance values of the composite arrays described above were determined to be in the range of about 15 up to about 45 mm$^2\cdot$K W$^{-1}$. In some embodiments, the contact resistance values can be selectively modified as a function of the etch time applied according to the methods described herein which can be in the range from about 30 seconds up to 30 minutes, more preferably about 1 minute up to 20 minutes, and most preferably about 2 minutes up to 15 minutes. In a preferred embodiment, the etch time is in the range of about 6 minutes up to 12 minutes, wherein the longer the etch time the higher the thermal contact resistance of the composite layer. In certain embodiments, the total thermal contact resistances increase at a rate of about 6 mm$^2\cdot$K W$^{-1}$ per about 2 minutes of etch time applied.

In some embodiments, the thermal conductivities are in the range of about 0.1 up to about 5 W m$^{-1}$ K$^{-1}$. In certain embodiments, the thermal conductivities of the polymer nanostructures individually or in arrays as described herein are approximately one up to 5-fold larger than that of the equivalent bulk film value of the same polymer due to molecular chain alignment in the direction of heat transfer, which enables the material to produce very low thermal transport resistances for a pure polymer.

In certain embodiments, the thermal conductivities of the polymer nanotube arrays described herein are maintained at least up to a temperature of about 250° C.

E. Electrical Properties of Arrays

In certain embodiments, the polymer arrays described herein are conductive or semiconductive. In some embodiments, the mobility of charge carriers in the arrays described herein are enhanced by at least an order of magnitude versus that of a bulk film formed of the same polymer. As used herein, mobility refers to the average drift velocity of carriers per unit electric field. Methods for determining charge mobility are known in the art.

III. Methods of Making Polymer-Based Arrays

A. Nanostructured Polymer-Based Arrays

In particular embodiments, a first step of forming the polymer-based arrays, as described herein, is performed using a suitable nanoporous template which can be wetted with a polymer-containing solution and dried to form polymeric nanostructures. In certain embodiments, the nanoporous template is a nanoporous anodic alumina (AAO) template. In some other embodiments, the template is formed at least in part from, but not limited to, track-etched polycarbonate, iron oxide, titanium oxide, silicon oxide templates, and Au, Ag, and Cu metal wherein the templates exhibit some degree of porosity. In some embodiments, the template has a porosity of about 20% up to about 80%, more preferably about 30% up to about 70%, and most preferably 40% up to about 60%. In some non-limiting embodiments, the template has a nominal pore diameter in the range of 1 nm up to about 1 µm, more preferably about 50 nm up to about 500 nm, and most preferably about 100 nm up to about 350 nm.

In some embodiments, the polymer solution wetted into the nanoporous template is formed into nanostructures which include, but not limited to polymer nanotubes, nanowires, or combinations thereof, of any shape, upon drying of the solution solvent. Such polymer nanotubes or nanowire structures are not limited to any particular length or diameter, which may be controlled as a function of the parameters of the nanoporous template. In some embodiments, the length of nanostructure is greater than the diameter of the nanostructure, such that the nanotubes and/or wires have a high aspect ratio. In some embodiments, the polymer nanofibers can have a length in the range of about 1 nm up to about 10 µm, more preferably up to about 5 µm, and most preferably up to about 1 µm. In some non-limiting embodiments, the polymer nanofibers have diameters which are approximately in the range of 1 to 500 nm, more preferably 100 to 400 nm, and most preferably 150 to 300 nm. In another non-limiting embodiment, wherein the polymer nanostructures form polymer nanotubes, the walls of the nanotubes have thicknesses which are in the range of 1 to 75 nm, more preferably 10 to 50 nm, and most preferably 20 to 40 nm. It should be understood that the particular lengths, diameters, and thicknesses of the polymer nanofiber structures may be uniform or non-uniform, or alternatively may include some degree of variation across the plurality of polymer nanostructures which form the arrays. Those skilled in the art will appreciate that the concentration of the polymer-containing solution, the selection of the nanoporous template parameters and other parameters resulting in the polymer nanofiber structures can be adjusted as needed. In preferred embodiments, the vertically-aligned array formed is a polymer nanotube (PNT) array.

In a subsequent step, a suitable template etching process (i.e., by applying an etchant to the template) can be applied to the template for a suitable period of time in order to at least partially expose the plurality of polymer nanostructures formed, and which may be in the form of nanotubes, nanowires, or combinations thereof. In some embodiments, the process is applied to the top surface of the template only or to the top and bottom of the template to at least partially expose the plurality of polymer nanostructures formed at each face of the template. In certain non-limiting embodiments, the template etching process is applied for about 30 seconds up to 30 minutes, more preferably about 1 minute up to 20 minutes, and most preferably about 2 minutes up to 15 minutes. In certain embodiments, the etching process involves the application of a liquid etchant to a top or bottom surface along a vertical axis of the template, such as, for example, to the top surface of the template which removes and at least partially frees end tips of the nanostructures from the template. In some embodiments, the etchant is a 1M potassium hydroxide solution. In other embodiments, phosphoric acid solutions, hydrofluoric acid (HF) can be used to etch the templates wherein the higher the molarity of the etchant solution the faster the etching process proceeds. In certain other embodiments, the templates can be removed using organic solvents such as, but not limited to chlorobenzene, toluene, and chloroform. In certain non-limiting embodiments, the volume of etchant applied to a surface of the template is approximately one drop. The volume of etchant which is applied will depend on the size of the template/array. In some non-limiting embodiments, the volume is in the range of about 0.1 µL up to about 1000 µL, more preferably about 1 µL up to about 500 µL, and most preferably about 10 µL up to about 50 µL.

Without wishing to be bound by any particular theory, by applying a solution of etching process for a chosen amount of time it was possible to precisely control the length of freed nanostructures wherein the greater the etching time the greater the length of the exposed polymer nanostructure. Upon exposure, capillary driven bundling of the freed nanostructures ends/tips resulted in densely packed polymer arrays having a surface morphology characterized by interconnected ridges exhibiting a constant width (W) along the ridge and spacing (S) between the ridges. In certain embodiments, the ridge width, W, is in the range of about 0.1 µm up to about 10 µm, more preferably about 0.25 µm up to about 5 µm, and most preferably about 0.5 µm up to about 2.5 µm. In certain embodiments the spacing, S, is in the range of about 1 µm up to about 50 µm, more preferably about 5 µm up to about 30 µm. In certain embodiments, the interconnected ridges of the array formed into percolating ridges. In some embodiments, the array includes a nanoporous template which includes a plurality of vertically aligned polymer nanostructures which form packed polymer arrays which are at least partially exposed on one or more surfaces of the template and wherein the surface morphology of the exposed polymer arrays comprise interconnected ridges which exhibit a constant width (W) and spacing (S) between the ridges.

In certain embodiments, a thermal treatment step was applied following the etching process described above. In certain non-limiting examples, the nanostructured polymer-based arrays, following the etching process, are heated up to about 250° C. for a period of time of about 10 seconds with the exposed nanotubes facing up. In some embodiments, the thermal treatment occurs at temperatures at or above 150° C., at or above 200° C., or at or above 250° C. In some embodiments, the time length of the thermal treatment applied is in the range of, but not limited, to about one second up to about 1 min, more preferably about 5 seconds up to about 45 seconds, and most preferably about 10 seconds up to about 30 seconds. In certain embodiments, the thermal treatment can be applied under ambient conditions, or alternatively, may be applied under an inert atmosphere of nitrogen, helium, or argon.

In one non-limiting example the method described above involves the steps of:

a) wetting a template comprising vertical nanotunnels with a polymer solution to form vertically aligned polymeric nanostructures in the nanotunnels;

b) applying an etching solution to one or more surfaces of the template for a period of time in order to partially etch the template and expose the plurality of polymeric nanostructures from the template; and c) subsequently applying a thermal treatment to the array.

B. Chain-Oriented Polymer-Based Arrays

Figure 10:
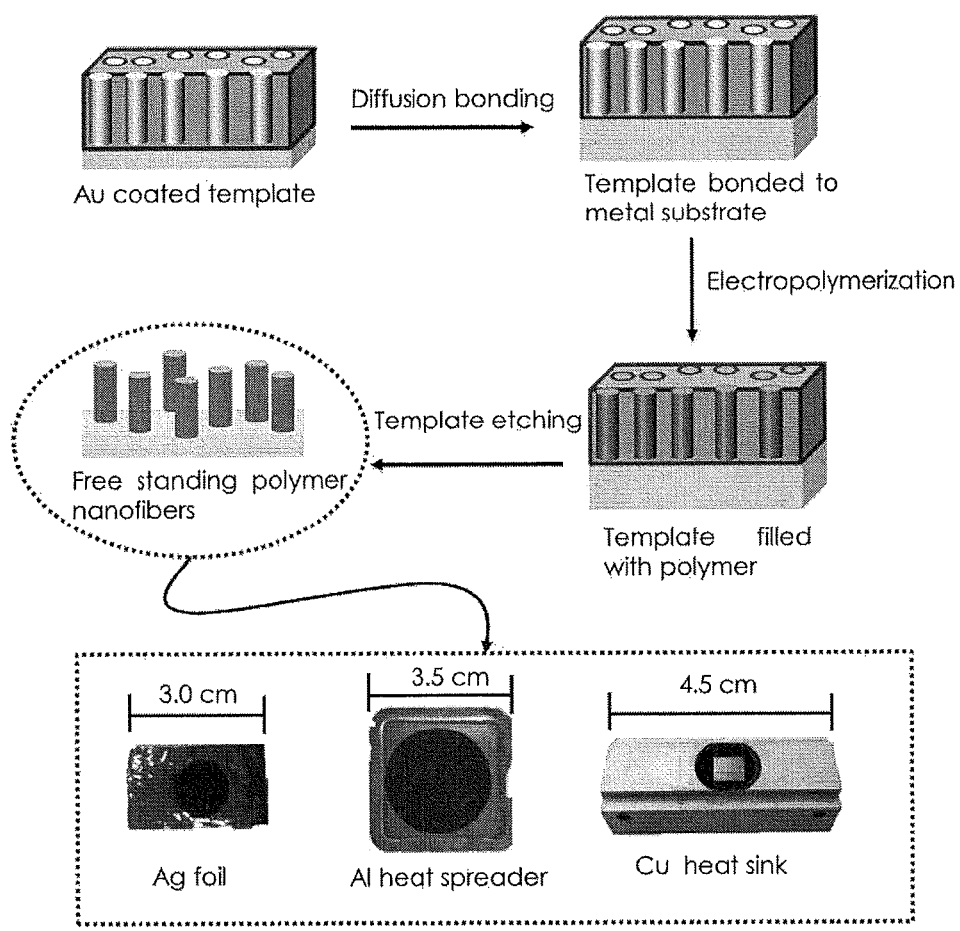
FIG. 10 shows a non-limiting illustrative example of a typical process used to fabricate chain-oriented polymer nanofibers using electrochemical polymerization which can be transferred to a variety of substrates.

In certain embodiments, chain-oriented polymer-based arrays can be fabricated via an electrochemical polymerization process as shown in FIG. 10. In some embodiments, the chain-oriented polymer-based arrays formed can be subsequently transferred to another substrate.

In some embodiments, a nanoporous template (e.g. porous anodic alumina) can be placed on a conducting substrate which serves as the working electrode in a three electrode electrochemical setup. In certain embodiments, the nanoporous template is a nanoporous anodic alumina (AAO) template. In some other embodiments, the template is formed at least in part from, but not limited to, track-etched polycarbonate, iron oxide, titanium oxide, silicon oxide templates, and Au, Ag, and Cu metal wherein the templates exhibit some degree of porosity. In some embodiments, the template has a porosity of about 20% up to about 80%, more preferably about 30% up to about 70%, and most preferably 40% up to about 60%. In some non-limiting embodiments, the template has a nominal pore diameter in the range of 1 nm up to about 1 µm, more preferably 50 nm up to about 500 nm, and most preferably 100 nm up to about 350 nm. In certain embodiments, the nanoporous template may be contacted or attached to a substrate using any suitable means known in the art. Typical substrates can include, but are not limited to metal or metal oxide substrates.

In non-limiting examples, a solution containing monomers of a suitable polymer (e.g. polythiophene or another solution-processable polymer) is prepared and introduced into the channels of the anodic template. In some embodiments, the monomer solutions can be de-oxygenated with an inert gas, such as, but not limited to argon or nitrogen. A voltage can subsequently be applied between the working and counter electrodes and the potential field causes electropolymerization of the monomer to form polymeric nanostructures within each channel in the nanoporous template. In some embodiments, the electropolymerization process is performed under inert atmosphere which can include in some non-limiting example the use of a slight overpressure of the inert atmosphere which is maintained during growth of the nanostructure.

Such electropolymerized nanostructures may be nanofibrous structures which include, but not limited to polymer nanotubes, nanofibers, nanowires, or combinations thereof. Such polymer nanotubes, nanofibers, or nanowire structures are not limited to any particular length or diameter, which may be controlled as a function of the parameters of the nanoporous template. In some embodiments, the length of nanostructure is greater than the diameter of the nanostructure, such that the nanotubes and/or wires have a high aspect ratio. In some embodiments, the polymer nanofibers can have a length in the range of about 1 nm up to about 10 µm, more preferably up to about 5 µm, and most preferably up to about 1 µm. In some non-limiting embodiments, the polymer nanofibers have diameters which are approximately in the range of 1 to 500 nm, more preferably 100 to 400 nm, and most preferably 150 to 300 nm. In another non-limiting embodiment, wherein the polymer nanostructures form polymer nanotubes, the walls of the nanotubes have thicknesses which are in the range of 1 to 75 nm, more preferably 10 to 50 nm, and most preferably 20 to 40 nm. It should be understood that the particular lengths, diameters, and thicknesses of the polymer nanofiber structures may be uniform or non-uniform, or alternatively may include some degree of variation across the plurality of polymer nanostructures which form the arrays. Those skilled in the art will appreciate that the parameters to produce the polymer arrays described above can be adjusted as needed. In preferred embodiments, the vertically-aligned array formed is a polymer nanotube (PNT) array.

In certain embodiments, the polymer nanostructures are grown within the nanoporous template at substantially constant potential and the length of the nanostructures and morphology (i.e., tubular versus solid fiber) of nanofibers can be controlled by pore diameter and the total charge passed through the electrochemical cell.

The nanoporous template can be partially or completely removed using any suitable means in order to liberate the vertically aligned array of polymer nanofibers. In a non-limiting example, the template can be treated with a potassium hydroxide solution for a period of time from about 24-48 hours. The isolated arrays of nanofibers can be neutralized with acid and water and can subsequently be attached to a substrate.

In one non-limiting example the method described above involves the steps of:

a) wetting a template comprising vertical nanotunnels with a monomer solution;

b) electropolymerizing the monomer solution to form vertically aligned polymeric nanostructures in the nanotunnels wherein the vertically aligned polymeric nanostructures formed comprise a chain-oriented amorphous polymer and can further include applying an etching solution to at least partially or completely etch the template away.

IV. Uses of Nanostructured Polymer-Based Arrays

In some embodiments, the nanostructured polymer-based arrays made according to the methods described herein can be used in applications such as for cooling electronics in automotive applications, in military electronics, for waste heat recovery, and in heat exchangers.

In certain embodiments, the nanostructured polymer-based arrays which can have thermal stability up to 300° C. or higher are well-suited for elevated-temperature applications. In one non-limiting example, thermal interface layers, based on the nanostructured polymer-based arrays may be able to operate reliably up to temperature where other previously reported TIMs cannot.

In other embodiments, the nanofiber arrays described herein can be used as thermally conducting dielectric materials for printed circuit boards (PCB) with improved heat dissipation and mechanical flexibility. For example, light emitting diodes (LEDs) are often mounted on metal surfaces with the need for a thermally conductive, but electrically insulating layer to separate the LED circuit from the metal base. The nanostructured arrays can be used in organic electronic devices where high surface area or special architecture are required for operation.

In yet other embodiments, non-conjugated polymer arrays can be used in triboelectric generators. Conjugated polymer arrays can be used for photodetection.

EXAMPLES

Example 1: Regioregular poly(3-hexylthiophene) Polymer Nanotube Arrays

Nanotube Fabrication:

Nanoporous anodic aluminum oxide templates (AAO) having a thickness of 60 µm and a nominal pore diameter of 200 nm were purchased from Whatman and used to fabricate polymer nanotube arrays using the template wetting method described herein. The AAO templates had an estimated porosity of 40-50%. Regioregular (with regioregularity=98%), average $M_n$=87,000, poly(3-hexylthiophene) (rr-P3HT) was purchased from Sigma-Aldrich (445703-1G) and was used as received.

Figure 1B:
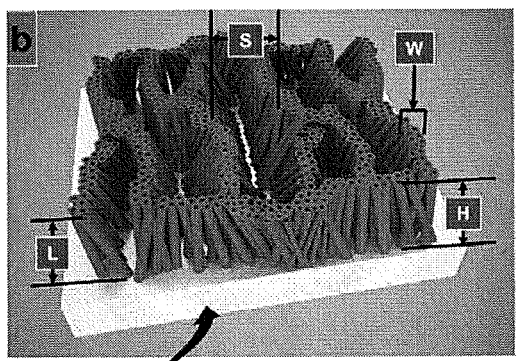
Figures 2A, 2B, 2C, 2D:
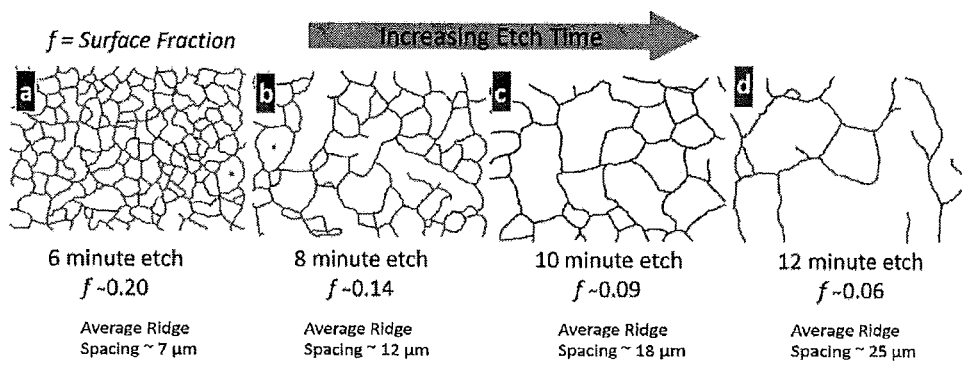
FIGS. 2A, 2B, 2C, and 2D show ridge traces of the arrays as a function of etch time (minutes) and their calculated surface fractions, f, as the etch time increased from 6 to 12 minutes at 2 minute intervals, respectively.

As shown in FIGS. 1A-1B, a non-limiting method for forming the PNT arrays involves preparing a solution of rr-P3HT (2 mg/mL) in chlorobenzene for use in a template wetting method. The AAO templates were placed on a clean glass slide and then 2 µL of the rr-P3HT solution was pipetted onto the top of each AAO template. After placing the solution onto the template, a second glass slide was used to sandwich the templates and create an even distribution of solution. The top slide was removed after sandwiching, and the solvent was allowed to evaporate under ambient conditions.

After drying, potassium hydroxide (KOH) was used to selectively remove the AAO template and reveal free-standing rr-P3HT nanotube arrays as depicted in FIG. 1A. Different etching times were applied and the samples were subsequently rinsed five times in a bath of deionized (DI) water to remove any excess KOH. After rinsing, the composites were placed on clean glass slides to dry. Following the etching process, the composites were heated at 250° C. for a period of time of 10 seconds with the exposed nanotubes facing up.

Structural Characterization:

A Zeiss scanning electron microscope (SEM) at 5 kV was used to determine the characteristic spacing between nanotube peaks, the degree of percolation, and the exposed nanotube length. The array height and the surface fraction were found using a Dimension 3100 scanning probe microscope (SPM) that utilizes automated atomic force microscopy (AFM) in tapping mode. In order to measure wall thickness, the AAO templates were completely removed, and a centrifuge was used to transfer the free nanotubes into a container of deionized (DI) water. The nanotube solution was then cast onto copper grids, and a JEOL 100CX II transmission electron microscope operated at 100 kV revealed the formation of nanotubes.

Figure 7:
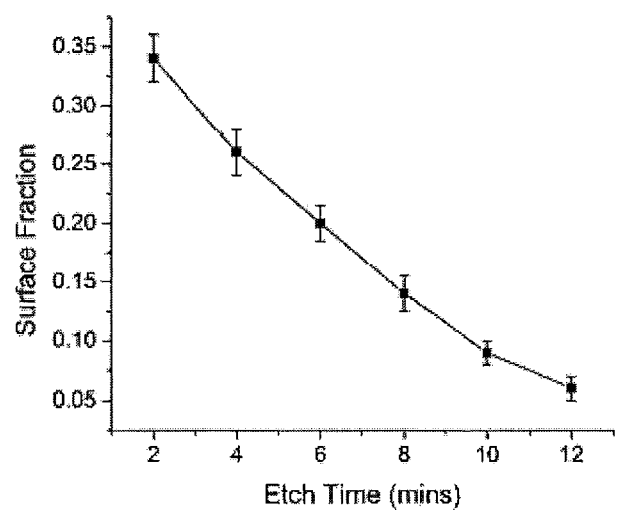
FIG. 7 is a graph of a rr-poly(3-hexylthiophene) nanotube array showing the surface fraction as a function of etch time (minutes).

The surface fraction of the PNT array was found to decrease as etch time and ridge formation increased. For etch times of 6 minutes and longer, there is no discernible/measurable change in the width of the PNT ridges, while the spacing between the ridges increased considerably. The surface fraction, f, as a function of etch time taken from heavily contrasted SEM images (not shown) were used to attain pixel counts for the ridged regions only and revealed ridge widening as the etch time increased from 6 to 12 min, respectively. FIGS. 2A-2D show the corresponding percolation ridge traces. The surface fraction, f, was reduced from 0.20±0.02 for the 6 minute etch time to a minimum of 0.06±0.01 for the 12 minute etch time. The relationship between etch time and surface fraction appear to be nonlinear since the magnitude of change in surface fraction decreases with etch time (FIG. 7). The measurement uncertainty was found by calculating the standard deviation of 10 measurements, 5 different spots on 2 separate samples with similar etch times.

Characterization of Surface Wetting:

Both the CA and CAH were measured by dispensing a 2 μL drop of deionized water onto the PNT surface with a Rame-Hart Model 250 Standard Goniometer. For the advancing and receding contact angle measurements, the dispensing needle was placed near the sample surface, and the CA was measured as excess fluid was dispersed (advancing CA) and then measured again as the fluid was retracted (receding CA). The CAH was found by taking the difference in the receding and advancing CA.

Using the Cassie-Baxter model, it was possible to predict the apparent CA of the textured version of the surface using the resulting surface fraction, f After an etching time of 4 min or longer, contact angles greater than 150° were observed. It was posited that the wetting fluid rests on top of the composite surface, which consists of rr-P3HT ridges and air. The particular wetting behavior observed was found only after application of a thermal treatment to the nanotube arrays by placing the templates on a hot plate at 250° C. with the exposed nanotubes facing up for 10 seconds and then rapidly cooling the composites under ambient conditions. In the absence of the thermal treatment, the surface contact angle was found to be ~0°.

Thermal Transport Measurements:

The thermal properties were measured using the photoacoustic method. The laser used in this study was an 1100 nm continuous wave fiber laser and the modulation frequency range was held at 300-4000 Hz to adequately measure the desired properties without penetrating through to the quartz layer. The acoustic fitting was carried out using the Levenberg-Marquardt method within a 1 dimensional heat flow model. Only the acoustic phase data was used in the heat flow model because it has been demonstrated previously that the phase data, as opposed to wave amplitude data, provides more reliable measurements.

Figure 8A:
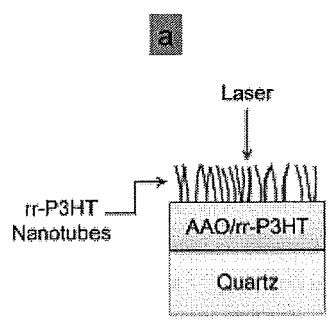
FIG. 8A shows a depiction of the sample configuration used to measure array thermal conductivity.
Figure 8B:
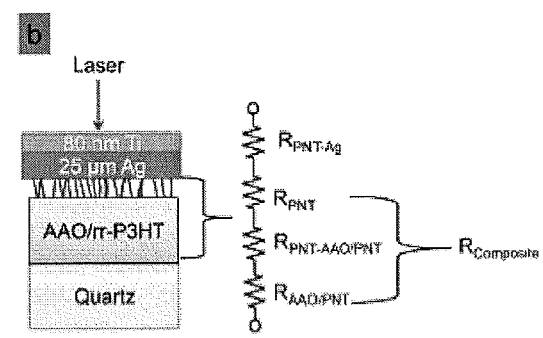
FIG. 8B shows a depiction of the sample configuration used to measure array total thermal resistance.

The sample configuration used to probe the nanotube array thermal conductivity is demonstrated in FIG. 8A and the configuration used to probe the total layer thermal resistance is depicted in FIG. 8B.

A 1 mm diameter pulsed laser was used to periodically heat the surface of a sample enclosed in a pressured helium chamber. The heat is conducted into the sample and upward into the helium gas resulting in periodic pressure fluctuations. The pressure fluctuations induce acoustic waves and the acoustic wave amplitude, and the phase is measured using a microphone. The sample configuration for the array thermal conductivity and interface resistance measurements are illustrated in FIGS. 8A-8B. For each measurement, the sample phase was compared to a reference of known properties (80 nm of Ti on a quartz slide), and the measured phase shifts, along with initial guess values for unknown properties, were used in a theoretical model to estimate the thermal properties of the samples, as shown in the tables below.

The sensitivity (Si) of the thermal conductivity measurement for the composite layer shown in FIG. 8B was calculated by perturbing a property (P) of value i by ±1% and then determining the corresponding phase shift using Equation (2) below:

$$S_i = p_i \frac{\partial \phi}{\partial p_i} \quad (2)$$

The fitting parameters used to determine the thermal conductivity of the 12 minute etched array are outlined in Table 1 below. For the thermal conductivity measurement, the unknown fitting parameters are the nanotube array (rr-P3HT 200 nm) thermal conductivity, the nanotube array density, the contact resistance between the quartz and AAO/rr-P3HT layer and the contact resistance between the nanotube array and AAO/rr-P3HT layer. The calculated uncertainty of the thermal conductivity measurements takes into account both the measurement and data fitting uncertainties. The measurement uncertainty for the unknown parameters was found by altering the properties by 5, 20, ⅕, and ¹⁄₂₀ and the thermal conductivity uncertainty was found by calculating the standard deviation of data fits with similarly low residuals. The fitting uncertainty was found by shifting the phase data ±1°. The total uncertainty was then calculated using Equation (3), below, where $\Delta$meas is the measurement uncertainty and $\Delta$fit is the data fitting uncertainty.

$$\Delta_{total} = \sqrt{\Delta_{meas}^2 + \Delta_{fit}^2} \quad (3)$$

The uncertainty analysis indicated that the confidence intervals for the contact resistance values were too large to accurately resolve these properties individually. This result motivated the sample configuration used to measure the total thermal resistance where the total layer resistance was measured and then we took the difference in these measurements to measure the impact of nanotube array morphology.

TABLE 1

Photoacoustic fitting parameters to determine the thermal conductivity of the 12 minute etched array. The fitted unknown values are shown in bold.

| | Density kg/m$^3$ | Thermal Conductivity W m$^{-1}$ K$^{-1}$ | Specific Heat J/kg-K | Thickness μm | Optical Absorption Length μm | Contact Resistance mm$^2$ · K W$^{-1}$ | Layer Resistance mm$^2$ · K W$^{-1}$ |
|---|---|---|---|---|---|---|---|
| Quartz | 2200 | 1.38 | 753 | 5000 | 0.001 | 4.30 ± 0.8 | 3623 |
| AAO/rr-P3HT | 800 | 1.30 | 900 | 25 | 0.001 | 0.10 ± 1.1 | 19.23 |
| rr-P3HT 200 nm | 405 ± 23 | 0.91 ± 0.2 | 1100 | 8 | 1.6 | 0.01 | 8.84 |
| He | 0.273 | 0.152 | 5190 | 0.00 | 0.001 | 0 | 0 |

Table 2, below, provides the fitting parameters used to determine the total layer resistance where the AAO/rr-P3HT composite layer density and thermal conductivity as well as the contact resistance between rr-P3HT nanotube array and the silver foil and the contact resistance between the AAO/rr-P3HT composite layer and the quartz slide were unknown. Based on sensitivity analysis (not shown), the laser pulse modulation frequency was chosen so that the measurements are not sensitive to the contact resistance with the quartz backing and its thermal conductivity. So the backing acts only as a stage to support the samples during measurements in a consistent way and it is not included in the total resistance of the interfaces.

TABLE 2

Photoacoustic fitting parameters to determine the total thermal resistance of the 10 minute etched sample. The fitted unknown values are shown in bold.

| | Density kg/m$^3$ | Thermal Conductivity W m$^{-1}$ K$^{-1}$ | Specific Heat J/kg-K | Thickness μm | Optical Absorption Length μm | Contact Resistance mm$^2 \cdot$ K W$^{-1}$ | Layer Resistance mm$^2 \cdot$ K W$^{-1}$ |
|---|---|---|---|---|---|---|---|
| Quartz | 2200 | 1.38 | 753 | 5000 | 0.001 | 464.70 ± 57 | 3623.18 |
| Composite Nanotube-AAO/rr-P3HT | 345.75 ± 25 | 1.21 ± 0.2 | 1100 | 35 | 0.001 | 2.01 ± 1.1 | 29.00 |
| Ag | 10490 | 429 | 236 | 25 | 0.012 | 0.09 | 0.06 |
| Ti | 4500 | 21.9 | 522 | 0.8 | 0.026 | 0.01 | 0.04 |
| He | 0.273 | 0.152 | 5190 | 0 | 0.001 | 0 | 0 |

Example 2: Chain-Oriented Amorphous Polythiophene Nanofiber Arrays

Nanofiber Fabrication:

Nanoporous anodic aluminum oxide (AAO) was purchased from Whatman Co (Anodise 13, 200 nm nominal pore diameter) and Synkera Nanotechnologies Inc (Unikera, 100, 55, 18 nm nominal pore diameter). Gold sputtering source (Au, 99.9999%) were purchased from Kurt J. Lesker Co. Unless otherwise noted all the chemicals were purchased from Sigma-Aldrich and used as received. Boron trifluoride ethyl ether (BF3.Et2O) was freshly distilled before use. One surface of the AAO templates must be converted into electrode to synthesize polythiophene (PT) in the nanochannels and therefore ~500 nm of gold was sputter-coated on one side of template and the gold layer was used as the working electrode for electropolymerization.

Polythiophene (PT) nanofibers were synthesized electrochemically using a three-electrode one-compartment cell with an electrolyte of thiophene in re-distilled boron fluoride-ethyl ether. The anodic potential was measured versus Ag/AgCl reference electrode. The AAO template bonded to metal was used as the working electrode and a Kapton mask defined the active area. Clean and polished stainless steel foil was used as counter electrode. All solutions were de-aerated with argon and a slight overpressure of argon was maintained during nanofiber growth. The nanofibers were grown at constant potential. The length and morphology (i.e., tubular versus solid fiber) of nanofibers can be controlled by the pore diameter, as well as the total charge passed through the electrochemical cell. Exemplary conditions which demonstrate such control are provided in Tables 3 and 4 below:

TABLE 3

Controlling the length of PT nanofibers through the total charge passed through the electrochemical cell during the electropolymerization of 50 mM thiophene at constant potential (1.3 V).

| Total Charge (Coulomb) | Array Height (μm) |
|---|---|
| 0.2 | 2.9 ± 0.8 |
| 0.5 | 3.9 ± 1 |
| 1.0 | 15.6 ± 2 |
| 1.5 | 19.9 ± 2 |

TABLE 4

Role of pore diameter on the morphology of PT nanofibers prepared at constant potential (1.3 V) and 1.0 coulomb charge using 50 mM of thiophene.

| Pore Diameter (nm) | Morphology |
|---|---|
| 200 | Mostly tubes |
| 100 | Solid fibers |
| 55 | Solid fibers |
| 18 | Solid fibers |

To dissolve the AAO template and liberate the vertically aligned array of PT nanofibers, the template was treated with potassium hydroxide for 24 hours. Isolated arrays were neutralized with 0.1 M hydrochloric acid and extensively washed with de-ionized water before attachment to the substrates. The neutral state of the PT nanofibers was confirmed with Raman spectroscopy as discussed below.

A simple and reproducible process using thermal diffusion bonding through a gold layer was developed to grow PT nanofibers directly on metal substrates. Excellent bonding occurred using a hydraulic pressure of about 45 MPa at 250° C. for 6 hours. The PT nanofibers were fabricated directly on metal substrates by electrochemical oxidation at constant potential (1.3V vs Ag/AgCl) in a three-electrode one-compartment cell using a computer-controlled potentiostat-galvanostat (Epsilon electrochemical system).

Structural Characterization:

X-ray diffraction data were obtained with PANanalytical diffractometer using Cu Kα radiation. PT nanofiber dispersions for microscopy were made by collecting the fibers using a centrifuge. Transmission electron microscopy (TEM) images and electron diffraction were collected on a Jeol 4000EX microscope. Polarized infrared absorption spectroscopy was used study the degree of chain orientation in PT nanofibers. Absorption data at two different polarizations were collected using a polarized infrared absorption spectroscopy microscope (FTS7000-UMA600) with a Perkin-Elmer wire grid polarizer.

Figure 11:
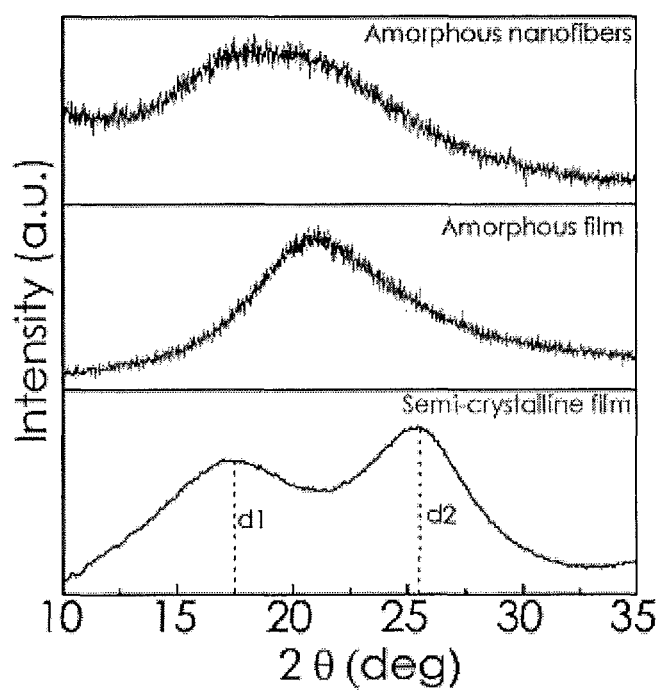
FIG. 11 shows a graph of the XRD patterns of polythiophene films and an array of polythiophene nanofibers (diameter ~200 nm) on substrates fabricated by electropolymerization wherein the x-axis is 2θ (degrees) and the y-axis is intensity (arbitrary units).

The PT nanofibers had diameters ranging from 18 to 300 nm and were found to be amorphous by electron diffraction and high-resolution TEM (not shown) analyses conducted at different locations along the fiber lengths. The nanofibers were also examined via standard powder x-ray diffraction (XRD). Only a broad hump was observed in the XRD pattern (FIG. 11) of PT films and ~200 nm PT nanofibers electropolymerized at constant potential. The XRD patterns for ~100, ~55, and ~18 nm PT nanofibers were flat with no peaks or significant humps (not shown). This suggests that all PT nanofibers were amorphous. HR-TEM was performed, as it provides the highest resolution of structural details, at various locations on different nanofibers, which confirmed the absence of long-range ordering in the electropolymerized nanofibers (not shown).

Figure 12:
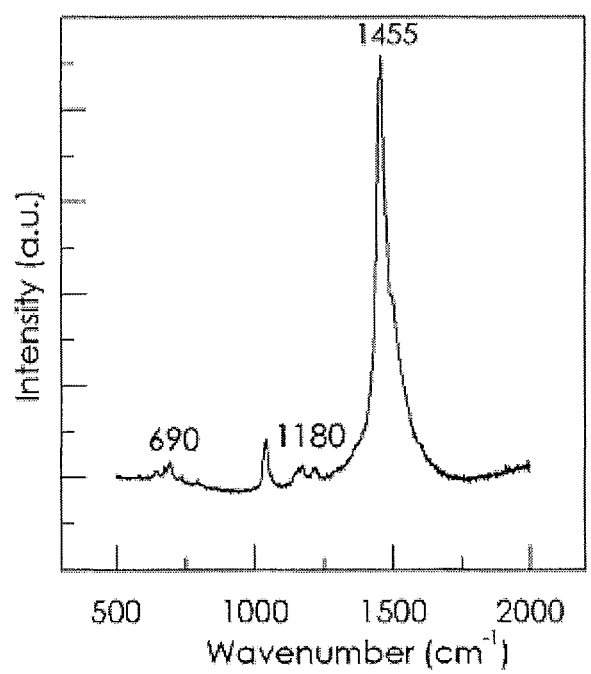
FIG. 12 shows the Raman spectrum of the surface of polythiophene nanofibers excited by a 785-nm laser beam wherein the x-axis is in wavenumbers (cm$^{-1}$) and the y-axis is intensity (arbitrary units).

Raman spectroscopic analysis was performed on the PT nanofibers to investigate the charge state of polymer. The Raman spectrum shown in FIG. 12, recorded by focusing the excitation laser beam on the surface of the PT nanofibers revealed that the most intense band of this spectrum is located at ca. 1455 cm$^{-1}$, which is assigned to the symmetric stretching mode of the aromatic C=C bond ring. This band is associated with neutral conjugated polythiophene segments (Shi, L. et al. *J Heat Transf.* 2003, 125, 881-888). The bands associated with the oxidized polythiophene or structural defects at around 1180 cm$^{-1}$ (C—C stretching) and 690 cm$^{-1}$ (C—S—C ring deformation) are weak.

A PIRAS-microscope (FTS7000-UMA600, Agilent) with Perkin-Elmer wire grid polarizer (186-0243) was used to study the degree of chain orientation in the polymers. Samples were oriented 10° parallel from the IR beam using grazing angle attachment (Pike Technologies 80 Spec). The freestanding PT nanofibers on metal foils were planarized in one direction by a "knock-down" process using a Teflon-based roller. The planarized PT nanofibers were mounted in the controlled atmosphere sample chamber of the PIRAS system. PIRAS spectra of the PT nanofibers surfaces were recoded with KBr as the beam splitter and a liquid nitrogen cooled MCT detector in the 400-4000 cm$^{-1}$ frequency range. It should be noted that any misalignment of the fibers from the knock-down procedure (i.e., if they do not all lay in the same direction) would only lessen the selective absorbance and hence lead to a lower orientation function.

Figure 13A:
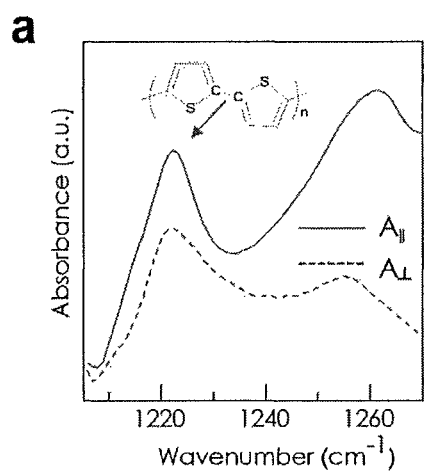
FIG. 13A shows the PIRAS spectra of polythiophene nanofibers from ~200 nm template and FIG. 13B shows the PIRAS spectra of polythiophene nanofibers from ~100 nm template wherein the x-axis is in wavenumbers (cm$^{-1}$) and the y-axis is absorbance (arbitrary units).
Figure 13B:
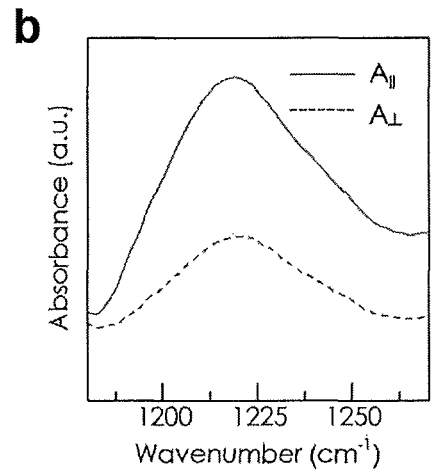

Based on PIRAS, higher absorbance was observed with parallel polarization, indicating structural anisotropy within the material (FIGS. 13A-13B). The vibration band at 1222 cm$^{-1}$, corresponding to $C_\alpha$-$C_\alpha$ inter-ring stretching along the polythiophene backbone (Chen, G. *Nanoscale Energy Transport and Conversion: A Parallel Treatment of Electrons, Molecules, Phonons, and Photons*. Oxford University Press: Oxford; N.Y., 2005), was used to estimate the dichroic ratio and orientation function. A dichroic ratio greater than 1 indicated preferential molecular chain alignment, and was used to estimate the percentage of chains aligned parallel to the fiber axis. Representative samples of the ~200 nm diameter tube arrays possessed a dichroic ratio of 2.0±0.2 and 25±4% preferential orientation The dichroic ratio and degree of orientation increased to 3.2±0.3 and 42±3%, respectively, for representative samples of the ~100 diameter fiber arrays. These data clearly indicate a distinct degree of chain orientation along the amorphous PT nanofiber axis as illustrated in FIG. 9, which increased significantly as the fiber diameter decreased.

Thermal Conductivity Measurements of Individual Fibers:

Microbridge measurements were performed to determine the thermal conductivity measurement of individual PT nanofibers with a suspended microbridge; and are described in detail elsewhere (Shi, L. et al. *J Heat Transf* 2003, 125, 881-888). The suspended microbridge measurement device consists of two adjacent $SiN_x$ membranes each patterned with a serpentine platinum resistance thermometer (PRT) and two electrodes, and supported by six, long, thin beams. A single PT nanofiber was placed across the gap between the two membranes and the measurements were carried out in an evacuated cryostat with pressure on the order of 10$^{-6}$ Torr. A DC current supplied to one PRT raises its temperature by $\Delta T_h$, and heat conduction through the sample causes a temperature rise in the adjacent, sensing membrane of $\Delta T_s$. The temperature rise in the heating and sensing membranes was measured from the temperature coefficient of resistance of the PRTs, and the thermal conductance of the nanofiber was determined from the total Joule heating and temperature difference between the heating and sensing membranes. Due to the low thermal conductance of some of the nanofiber samples, it is necessary to account for the background heat transfer between the two PRTs via residual gas molecules and radiation. To eliminate the background conductance, the temperature rise on the sensing membrane was measured relative to the temperature rise on the sensing membrane of a blank device with no nanostructure. The measured thermal resistance of the sample is expected to contain a contribution from the contact resistance between the nanofiber and the $SiN_x$ membranes. The reported thermal conductivities and uncertainties do not include the effect of contact resistance because its magnitude is difficult to estimate.

Due to the low thermal conductance of some of the nanofiber samples, on the order of 1 nW K$^{-1}$, it is necessary to account for the background heat transfer between the two PRTs via residual gas molecules and radiation. Neglecting this background conductance, which is comparable to the sample conductance, can lead to an overestimate of the thermal conductivity. To eliminate the background conductance, the temperature rise on the sensing membrane was measured relative to the temperature rise on the sensing membrane of a blank device with no nanostructure. Such background elimination is carried out either with a separate background conductance measurement of a blank reference device, or simultaneously with a new differential measurement method. The background thermal conductance makes a relative contribution of 5% for the nanofibers with diameter greater than 200 nm, and between 15 and 50% for the smaller diameter nanofibers.

The uncertainty in the thermal conductivity contains a contribution from uncertainty in the diameter and suspended length measured by TEM, which ranges between 2-17% for the samples studied, as well as a contribution from the measured thermal conductance, which correspondingly depends on the uncertainty in the Joule heating supplied to the heating membrane, the uncertainty that results from background subtraction, and the uncertainty in the measured temperature rise in the heating and sensing membranes, which combined can contribute between 1-11% for the samples studied. The uncertainty in the sample temperature is taken as the difference in temperature between the heating and sensing membrane, which is typically 2-6 K.

Thermal Conductivity and Interface Resistance Measurements of Nanofiber Arrays:

A photoacoustic technique which employs a modulated laser beam to periodically heat a sample in a closed volume where the thermal response of the sample is converted into pressure waves that arc detected by a microphone and recorded using a lock-in amplifier was used to measure the total thermal resistance of PT nanofiber TIMs and the thermal conductivity of PT nanofiber arrays.

Specifically, the output from an 1100 nm continuous-wave fiber laser passes through an acousto-optic modulator, which is maintained at modulation frequencies between 300 and 4000 Hz by a function generator. The beam is focused through a polished quartz window on the top of photoacoustic cell and onto the surface of the sample. The gas in the photoacoustic cell is He that is pressurized to 7, 70, or 140 kPa. The fully assembled sample consists of 80 nm of Ti on a 25-μm Ag foil and 1 μm of gold on the backside. The Au-coated Ag foil is the growth substrate as previously mentioned in the fabrication description; the Ti layer is deposited on the Ag foil to absorb the laser energy. The array conductivity sample stack was created by flipping the PT nanofiber array over and placing it on top of the quartz. The PT nanofiber array is attached to the Au (growth substrate) on one side and to a 3 mm quartz disc on the other side. The 80 nm layer of Ti on top of the silver foil absorbs the laser energy and introduces the periodic heating into the sample.

Figure 14:
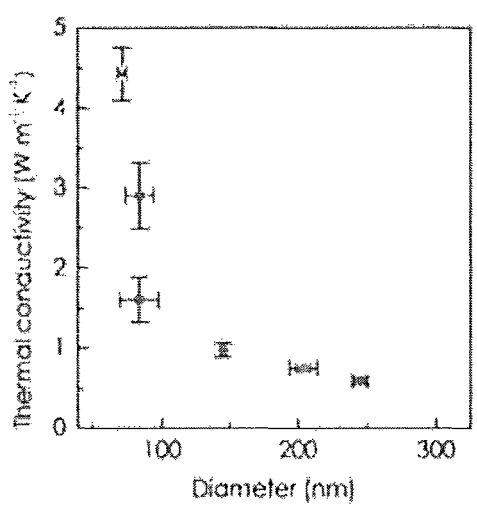
FIG. 14 shows a graph of the representative single fiber thermal conductivity (W m$^{-1}$K$^{-1}$) measurements at room temperature as a function of fiber diameter (nm).

The effective thermal conductivities of films of vertically-aligned PT nanofibers (~200 nm diameter tubes) measured using a photoacoustic technique are shown at FIG. 14. Films with nanotube heights of 2 to 20 μm exhibited thermal conductivities ranging from 0.8 to 1.0 W m$^{-1}$ K$^{-1}$ with little dependence on nanotube height. The estimated thermal conductivity of individual fibers within these films was 1.4±0.3 W m$^{-1}$K$^{-1}$ assuming solid fibers with a fill fraction of 60% (estimated from the manufacturer's template pore density and diameter specifications). Further correction for the void space within the tubes (based on a diameter of 200 nm and a wall thickness of 40 nm from TEM images (not shown)) yielded an estimated individual tube thermal conductivity of 2.2±0.6 W m$^{-1}$K$^{-1}$ with an overall fill fraction of ~38%.

The thermal conductivity of the fibers increased strongly as the fiber diameter decreased which agreed with the chain orientation measurements. The thermal conductivity of solid nanofibers with diameters of 204±10 and 71±3 nm increased monotonically from 100 to 350 K. The thermal conductivity of the PT nanofiber was found to increase modestly at 300 K (κ ~T$^{0.4}$ for d=71 nm and κ~T$^{0.4}$ for d–245 nm, wherein d is diameter). While the dominant phonon scattering mechanism in the crystalline fibers at room temperature was an harmonic phonon-phonon (umklapp) scattering, the nanofibers appeared to still be dominated by inter-chain scattering due to disorder despite some degree of chain orientation. It is likely that the PT nanofiber possess a strong increase in short-range ordering, while long-range order is still absent.

The room temperature thermal conductivity of the 245±5, 204±10, 145±2, 84±14, 84±12, and 71±3 nm fibers were found to be 0.6±0.1, 0.8±0.1, 1.0±0.1, 1.6±0.3, 2.9±0.4, and 4.4±0.3 W m$^{-1}$K$^{-1}$, respectively, the latter of which was 23 times higher than for bulk PT (0.19±0.02 W m$^{-1}$K$^{-1}$ as measured on a film using the photoacoustic technique). The differences in thermal conductivity of the three fibers between 71 and 84 nm in diameter are an indication of fiber-to-fiber variability in chain alignment and an average thermal conductivity of 3.0 W m$^{-1}$K$^{-1}$ should be used when comparing fiber diameters to consider size effects. It is worth noting that these values are the apparent thermal conductivity of individual nanofibers, and are lower than the intrinsic diffusive thermal conductivity because of the presence of contact thermal resistance in the two-probe thermal measurement.

Thermal Interface Material Attachment:

The tips of the PT nanofiber arrays were placed in contact with an opposing substrate in the wet state, and allowed to dry under a fixed load (~200 kPa for 8-10 hours under atmospheric conditions). Wetting the arrays with water, alcohol, or FC-72 produced similar results.

Based on adhesion testing it was shown that the tips appeared to adhere strongly to certain surfaces, such as quartz, through van der Waals interactions. The arrays were detached by simply rewetting the interface, and re-attached by drying them in contact with the substrate again.

More specifically, the normal adhesion force was investigated by collecting a PT nanofiber array in the wet state with a clean surface with its aligned nanofiber surface in contact with the quartz surface. After the drying on a target surface, a pin was glued on the Ag foil by 5 min epoxy. The epoxy adhesive was coated on the center of the sample with an area smaller than that of the Ag foil. To further exclude the possibility of the epoxy adhesive creeping up to the stalks of the specimen, we pre-cured the epoxy gel for about 1 min before applying it to the specimen. Then, another pin was glued to the backside of the substrate glass to measure the normal pull-off force (i.e., normal adhesion force). The sample sizes were 0.5-0.8 cm$^2$. The normal adhesion strength was tested using a standard tensile test machine. The samples were tested at a displacement rate of 1.0 mm·min$^{-1}$. The 1.9 μm array failed at 851 Ncm$^{-2}$ and the 11.6 μm array failed at 87 Ncm$^{-2}$, while both 4.9 and 15.9 μm failed at the epoxy interface used for testing, indicating a normal force of greater than 100 N cm$^{-2}$ in both cases.

Figure 15:
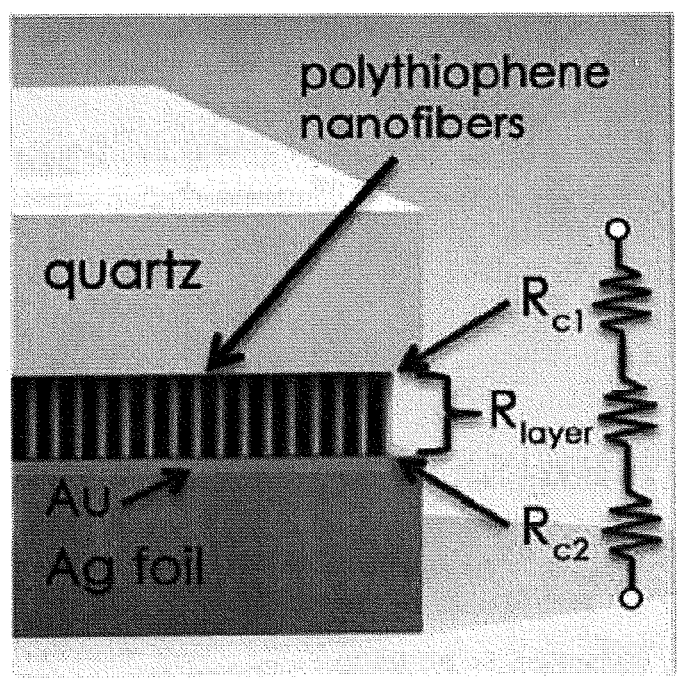
FIG. 15 shows an illustrative representation of a thermal interface material (TIM) with component thermal resistances.
Figure 16:
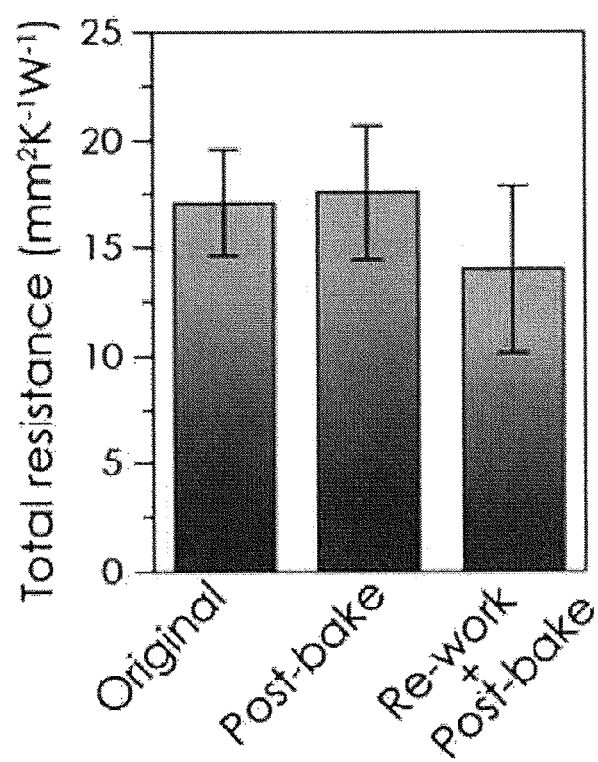
FIG. 16 shows a graph of the total thermal resistance (mm$^2$K$^{-1}$ W$^{-1}$) measurements of PT-NT TIMS taken using a photoacoustic method and includes post-bake data obtained when the sample was heated in air for 100 h at 200° C. and re-work+post-bake data obtained after the sample was wetted, removed from the quartz, then re-wetted and on the quartz. The error bars represent one standard deviation of 4-6 measurements on each TIM.

Testing of the thermal resistances of three PT nanofiber TIMs (FIG. 15) fabricated (with ~200 nm diameter, 2-3 μm tall tubes), were measured using the photoacoustic technique, and were determined to be 12.8±1.3, 14.4±3.3, and 17.1±2.5 mm$^2$K W$^{-1}$, respectively. The TIM was remarkably robust—after thermal treatment for 100 h at 200° C., detachment, and then reattachment, with no appreciable increase in thermal resistance detected (3% increase after baking, 18% decrease after reattachment) (FIG. 16). The decrease in resistance after reattachment likely resulted from small changes in the morphology of the tips that improved surface contact.

Simulated RF Device Testing:

The impact of enhanced thermal conductivity on the total thermal interface material (TIM) resistance was examined by estimating component resistances within the system. The intrinsic layer resistance, Rlayer, is given by L/κ, where L is the array height (~2.5 μm) and κ is the layer thermal conductivity (0.8 Wm$^{-1}$K$^{-1}$) for Rlayer ~3.1 mm$^2$ KW$^{-1}$. The total TIM resistance of one sample was 17.1 mm$^2$ KW$^{-1}$ indicating that the combined contact resistance was approximately 14 mm$^2$ KW$^{-1}$. To compare our material to a scenario where the amorphous PT nanofibers would have no enhancement of thermal conductivity, we estimate the layer resistance to be 21.9 mm$^2$ KW$^{-1}$ (κ=0.19 Wm$^{-1}$K$^{-1}$, solid fibers with 60% fill fraction). If we assume that the contact resistance is independent of the layer thermal conductivity, we can estimate the total resistance of a PT nanofiber TIM with no enhancement to be approximately 34 mm$^2$ KW$^{-1}$. A doubling of the total resistance is a conservative estimate since the fibers are tubes with a hollow core, which will create an even higher layer resistance. For the device operated at about 100 W cm$^{-2}$ this increase in resistance would cause the device to operate at least 17° C. hotter, reducing long-term reliability, or at reduced power to maintain equivalent operation temperature. This demonstrates the practical necessity of using polymer nanofibers with enhanced thermal conductivity for a TIM.

The thermal interface materials were as follows:

Solders. Solder joints are solid metal TIMs that are made of low melting point metals such as indium and tin that are melted and allowed to cool in between the heat source and sink to provide a rigid interface.

Thermal grease. Thermal grease is a thick paste made of either silicone or hydrocarbon oil that has a conductive filler to improve thermal conductivity. The main types of fillers used are metals, ceramics, and carbon.

Phase change material (PCM). PCMs are a composite comprised of a paraffin or polymer matrix and a thermally conductive filler such as a metal oxide. PCMs typically have a melting temperature of around 50-90° C. and behave much like a highly viscous grease above this temperature.

Gels. Gels are typically a silicone polymer with a thermally-conductive filler that can be cured. Prior to curing they behave much like a thermal grease, and after curing they are similar to a low modulus polymer.

Adhesives. Thermally conductive adhesives are essentially a double-sided tape with low thermal resistance.

The thermal measurements were performed using custom SiC Pt resistor-thermometer chip affixed to a Cu block heat sunk to a temperature-controlled stage. Thermal coefficient of resistance calibration data for each platinum resistor was obtained by varying the temperature of the stage and recording resistance while supplying a low current level of less than 4.2 mA. During calibration the heat dissipated through the resistor was negligible (<0.32 mW). Temperature data from a Type-T thermocouple inserted into the Cu block was used to establish the relationship between temperature and resistance, which was essentially linear. Thermal resistance testing was then performed by varying the power dissipation of the resistor while performing a 4-wire resistance measurement and measuring the block temperature. Thermal resistance was computed as the temperature difference between the resistor and thermocouple divided by the power input to the resistor. Voltage and current measurements were performed with an HP 34401A multimeter capable of resolving input power to within approximately 0.1%. Heat loss to the environment was assessed using numerical modeling assuming a natural convection coefficient of 10 $Wm^{-2}K^{-1}$ and was found to be negligible. Thermal interface resistance was obtained through numerical modeling of the configuration in ANSYS TAS v11.0. In this model, the thermal conductivity of Al was taken as 167 $W\ m^{-1}K^{-1}$, Cu alloy C14500 as 355 $W\ m^{-1}K^{-1}$, AuSn solder as 57 $W\ m^{-1}K^{-1}$ and Mo as 140 $W\ m^{-1}K^{-1}$. The thermal conductivity of SiC was taken as a function of temperature as measured via laser flash. Uncertainty in reported thermal resistance assumes +/−2° C. temperature measurement error and +/−7% on SiC conductivity. Thermal cycling was performed by applying and removing ~100 W of heat to the Pt resistor on 300 s intervals for 80 cycles, or until the sensed resistor temperature reached a cut-out limit of 250° C. A common Ag-filled epoxy purchased from Epoxy Technology was cycled to compare its reliability to that of the PT nanofiber TIMs under similar conditions. The resistance of the epoxy increased by 354% from 13 $mm^2KW^{-1}$ to 46 $mm^2\ KW^{-1}$ in only 36 cycles. Based on the coefficient of thermal expansion (CTE) mismatch between SiC and Cu ($1.2\times10^{-5}\ K^{-1}$), a temperature change of 180° C. would cause the outer edge of the Cu heat sink to expand approximately 6 µm relative to the SiC chip. The total length of the PT nanofibers in the device were only 2-3 µm, but they stayed well adhered indicating that the tips of the fibers must slide along the surface while maintaining contact.

Figure 17:
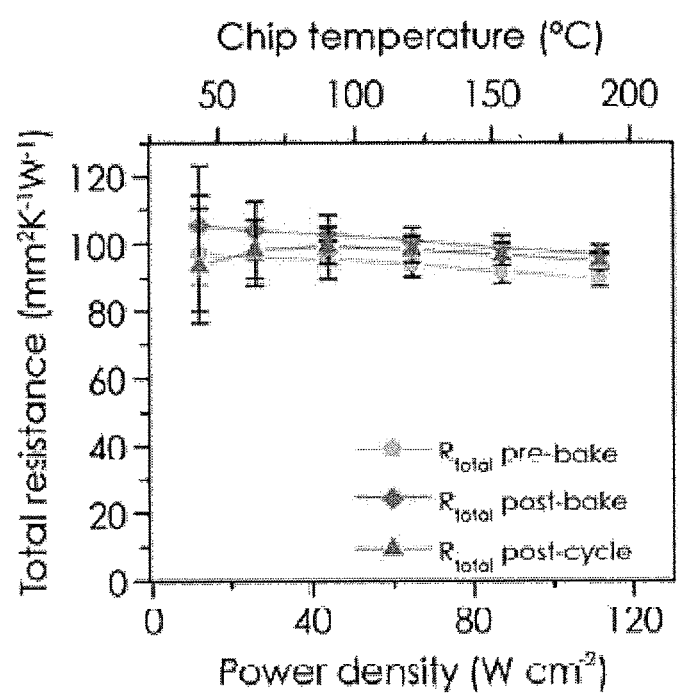
FIG. 17 shows a graph of the total thermal resistance (mm$^2$K$^{-1}$ W$^{-1}$), $R_{total}$, of the polythiophene nanofiber TIM measured as a function of power density (W cm$^{-1}$) before baking at 130° C. for 308 hours, after baking, and after thermal cycling.

The PT nanofiber TIM integrated into a high power silicon carbide radio frequency device simulator was held at 130° C. for 308 hours, and then thermally cycled in air between 5 and 200° C. 80 times over 16 hours. The total PT nanofiber TIM resistance as a function of power density did not change noticeably after this aggressive thermal treatment and cycling (FIG. 17), which was particularly noteworthy given the large mismatch in the thermal expansion coefficients of SiC and Cu (the difference is $1.2\times10^{-5}\ K^{-1}$) and the thin bond line (2-3 µm). It was noted that the total resistance of the PT nanofiber TIM decreased modestly as the temperature was increased up to 460 K. Given that the contact resistance is unlikely to change significantly with temperature, this implied that the thermal conductivity of PT nanofiber continues to increase slowly at temperatures well above 300 K. The total resistance in the device was significantly higher (85-105 $mm^2\ KW^{-1}\pm10\%$) than in lab-scale tests, owing to processing voids at the interface where the template was bonded to the Cu block.

We claim:

1. An array comprising:
   a plurality of rows of vertically aligned polymeric nanostructures, each of the nanostructures having a base and an end tip,
   wherein the plurality of rows of vertically aligned polymeric nanostructures are embedded in a template and one or more surfaces of the template have been etched for a period of time of between about four to about twelve minutes to at least expose the end tips of the plurality of rows of vertically aligned polymeric nanostructures from the template,
   at least two of the end tips of the nanostructures are in contact to form a bundle having a tip, and
   wherein at least the tips of two bundles are in contact to form a ridge,
   wherein the array comprises a plurality of ridges, at least two ridges being interconnected and each ridge having a constant width (W) along the ridge, and
   wherein the array has a surface fraction, the ratio of the total surface area to the surface area in contact with the nanostructures, of between about 0.01 and about 0.30.

2. The array of claim 1, wherein a spacing (S) between the ridges is uniform.

3. The array of claim 1, wherein the plurality of vertically aligned polymeric nanostructures comprises polythiophene.

4. The array of claim 1, wherein at least a portion of the plurality of polymeric nanostructures are polymer nanotubes, nanofibers, nanowires, or combinations thereof.

5. The array of claim 4, wherein the nanotubes or nanofibers are formed of a conjugated polymer.

6. The array of claim 5, wherein the conjugated polymer is regioregular poly(3-hexylthiophene).

7. The array of claim 1, where the template is a nanoporous anodic alumina template.

8. The array of claim 1, wherein the width (W) is between about 0.5 µm and about 2.5 µm.

9. The array of claim 2, wherein the spacing (S) is between about 5 µm and about 30 µm.

10. The array of claim 1, wherein one or more surfaces of the array have a contact angle between 90 and 170°.

11. The array of claim 1, wherein the one or more surfaces are superhydrophobic and have a contact angle greater than about 150°.

12. The array of claim 1, wherein the array has a thermal contact resistance between about 15 and about 45 $mm^2\cdot K\ W^{-1}$.

13. The array of claim 1, wherein the array has a thermal conductivity between about 0.1 and about 5 $W\ m^{-1}\ K^{-1}$.

14. The array of claim 1, wherein the template was etched for a period of time of about 6, 8, 10, or 12 minutes.

15. The array of claim 1, wherein the template was etched for a period of time of between about 6 and 12 minutes.

16. A method of fabrication of a nanostructured polymer-based array comprising the steps of:

a) wetting a template comprising vertical nanotunnels with a polymer solution to form vertically aligned polymeric nanostructures in the vertical nanotunnels;
b) applying an etching solution to one or more surfaces of the template for a period of time of between about four to about twelve minutes to etch the template and at least expose end tips of the plurality of polymeric nanostructures from the template; and
c) applying a thermal treatment to the array;
wherein the at least partially exposed polymeric nanostructures have end tips, at least two of the end tips of the nanostructures are in contact to form a bundle having tips wherein at least the tips of two bundles are in contact to form a ridge,
wherein the array comprises a plurality of ridges,
wherein at least two ridges are interconnected,
wherein each ridge has a constant width (W) along the ridge, and
wherein the array has a surface fraction, the ratio of the total surface area to the surface area in contact with the nanostructures, of between about 0.01 and about 0.30.

17. The method of fabrication of claim 16, where the period of time is about 6, 8, 10, or 12.

18. The method of fabrication of claim 16, where the period of time is between about 6 and 12 minutes.

19. The method of fabrication of claim 16, wherein at least a portion of the plurality of polymeric nanostructures are polymer nanotubes, nanofibers, nanowires, or combinations thereof.

20. The method of fabrication of claim 16, wherein the nanostructures are formed of a conjugated polymer.

21. The method of fabrication of claim 20, wherein the conjugated polymer is regioregular poly(3-hexylthiophene).

22. The method of fabrication of claim 16, wherein a spacing (S) between the ridges is uniform.

23. The method of fabrication of claim 16, wherein the width (W) is between about 0.5 μm and about 2.5 μm.

24. The method of fabrication of claim 16, wherein the spacing (S) is between about 5 μm and about 30 μm.

25. The method of fabrication of claim 16, wherein the etching solution comprises potassium hydroxide.

* * * * *